United States Patent
Kim et al.

(10) Patent No.: US 8,558,324 B2
(45) Date of Patent: Oct. 15, 2013

(54) COMPOSITE DIELECTRIC THIN FILM, CAPACITOR AND FIELD EFFECT TRANSISTOR USING THE SAME, AND EACH FABRICATION METHOD THEREOF

(75) Inventors: Il-Doo Kim, Seoul (KR); Dong-Hun Kim, Incheon (KR); Ho-Gi Kim, Seoul (KR); Nam-Gyu Cho, Daegu (KR)

(73) Assignee: Korea Institute of Science and Technology (KR)

( * ) Notice: Subject to any disclaimer, the term of this patent is extended or adjusted under 35 U.S.C. 154(b) by 295 days.

(21) Appl. No.: 12/387,502

(22) Filed: May 4, 2009

(65) Prior Publication Data

US 2009/0278211 A1    Nov. 12, 2009

(30) Foreign Application Priority Data

May 6, 2008    (KR) .................. 10-2008-0041967
Jul. 2, 2008    (KR) .................. 10-2008-0064112

(51) Int. Cl.
*H01L 29/78*    (2006.01)
*H01G 4/06*    (2006.01)
*C23C 14/34*    (2006.01)
*C09D 1/00*    (2006.01)

(52) U.S. Cl.
USPC ............... 257/411; 257/E29.255; 204/192.1; 361/311; 106/286.4; 106/286.5; 106/286.2

(58) Field of Classification Search
CPC . H01G 4/1218; H01G 4/20; H01G 21/02194; H01G 21/31604; H01G 28/55; H01G 29/7869; H01G 51/0525
USPC ......................................... 257/411; 204/192.1
See application file for complete search history.

(56) References Cited

U.S. PATENT DOCUMENTS

| | | | |
|---|---|---|---|
| 2004/0002176 A1* | 1/2004 | Xu | 438/40 |
| 2004/0121566 A1* | 6/2004 | Laibowitz et al. | 438/482 |
| 2004/0232468 A1* | 11/2004 | Solayappan et al. | 257/310 |
| 2007/0099005 A1* | 5/2007 | Leung et al. | 428/447 |

OTHER PUBLICATIONS

Sea-Fue Wang, Dielectric properties and microstructure of nano-MgO dispersed Ba0.3Sr0.7TiO3 thin films prepared by sputter deposition, Journal of Applied Physics 98, 014107 _2005_.*

(Continued)

*Primary Examiner* — Zandra Smith
*Assistant Examiner* — Lawrence Tynes, Jr.
(74) *Attorney, Agent, or Firm* — Ostrolenk Faber LLP

(57) ABSTRACT a composite dielectric thin film capable of high dielectric constant, low leakage current characteristics, and high dielectric breakdown voltage while being deposited at a room temperature, a capacitor and a field effect transistor (FET) using the same, and their fabrication methods. The composite dielectric thin film is deposited at a room temperature or less than 200° C. and comprises crystalline or amorphous insulating filler uniformly distributed within an amorphous dielectric matrix or within an amorphous and partially nanocrystalline dielectric matrix.

6 Claims, 17 Drawing Sheets

(56) References Cited

OTHER PUBLICATIONS

Sea-Fue Wang et al., Dielectric properties and microstructure of nano-MgO dispersed Ba0.3Sr0.7TiO3 thin films prepared by sputter deposition, Jul. 15, 2005,Journal of Applied Physics 98.*

Untranslated Korean Office Action mailed Jun. 30, 2010 in connection with corresponding Korean Application No. 10-2008-0064112.

Dielectric Properties and Microstructure of nano-MgO Dispersed $Ba_{0.3}Sr_{0.7}TiO_3$ Thin Films Prepared by Sputter Deposition, *Journal of Applied Physics*, 98, 014107, Wang, et al., 2005 American Institute of Physics.

*Improvement in Retention Time of Metal-Ferroelectric-Metal-Insulator-Semiconductor Structures using MgO doped $Ba_{0.7}Sr_{0.3}TiO_3$ Insulator Layer*, vol. 83, No. 3, Tseng, et al., 2003 American Institute of Physics.

* cited by examiner

COMPOSITE DIELECTRIC THIN FILM, CAPACITOR AND FIELD EFFECT TRANSISTOR USING THE SAME, AND EACH FABRICATION METHOD THEREOF

BACKGROUND OF THE INVENTION

1. Field of the Invention

The present invention relates to a composite dielectric thin film capable of high dielectric constant, low leakage current characteristics, and high dielectric breakdown voltage while being deposited at a room temperature, a capacitor and a field effect transistor (FET) using the same, and their fabrication methods.

2. Description of the Related Art

Recently, development of a transistor using oxide semiconductor (ZnO, $In_2O_3$, $SnO_2$, $InGaZnO_4$, and the like) as a channel layer (which is also referred to as a 'channel region', hereinafter) has been actively progressing. In particular, research on application of oxide semiconductor to a flexible electronic element and a transparent display based on the excellent semiconductor properties is ongoing.

Development of such flexible transistor has a restriction that the temperature of a fabrication process should be very low in consideration of stability of temperature at which a plastic substrate can tolerate. In addition, for its application to a substantial mobile circuit (namely, a circuit to which power can be supplied by using a battery), a driving voltage of a transistor element should be lowered to below 5V. In short, two factors of a low temperature process and a low voltage driving are critical in selecting a semiconductor channel layer and a gate insulating film of the transistor.

In order to obtain a low driving voltage, namely, a high capacitance value, of the transistor, a gate insulating film of high dielectric constant or a thin gate insulating film should be used. However, the plastic substrate generally has a rough surface (surface roughness: Rms~3 nm or larger). If a low voltage driving transistor is fabricated by forming a thin gate insulating film on the rough substrate, a pin hole would be easily formed in the fabrication process or an insulation breakdown occurs at a low voltage due to a non-uniform step coverage, shortening the long life span and degrading stability of the element.

To overcome such problem the gate insulating film of 200 nm or thicker needs to be deposited, and in order to obtain a sufficiently low driving voltage even with a gate insulating film with a thickness of 200 nm or larger, a dielectric constant 15 or larger should be secured. In particular, in order to fabricate a gate insulating film on the plastic substrate to provide flexibility, a room temperature process is essential.

The organic insulating film is advantageous in that it can be easily fabricated at a low temperature, but its dielectric constant value is low by 3 to 6. Silicon dioxide ($SiO_2$ with a dielectric constant 4) or silicon nitride (SiNx with a dielectric constant 7) commonly used for a gate insulating film of a polysilicon (Poly-Si) transistor or amorphous Si transistor has relatively low dielectric constant values. Although $SiO_2$ and SiNx have high breakdown characteristics based on the stable leakage current characteristics, it needs to be deposited at a high temperature of 200° C. or higher, so there is a restriction in directly depositing $SiO_2$ and SiNx on the plastic substrate.

In an effort to overcome such problem, there has been attempted to deposit high dielectric gate insulating film, namely, tantalum oxide ($Ta_2O_5$), strontium titanate ($SrTiO_3$), yttrium oxide ($Y_2O_3$), zirconate ($ZrO_2$), barium strontium titanate ($(Ba,Sr)TiO_3$), barium zirconate titanate ($(Ba,Zr)TiO_3$)[C. D. Dimitrakopoulos, S. Purushothaman, J. Kymissis, A. Callegari, and J. M. Shaw, Science 283, 822 (1999)], hafnium oxide ($HfO_2$) [K. Nomura, H. Ohta, A. Takagi, T. Kamiya, M. Hirano, and H. Hosono, Nature 432, 488 (2004)], Alumina ($Al_2O_3$), titanate ($TiO_2$), $Bi_{1.5}Zn_{1.0}Nb_{1.5}O_7$ [I. D. Kim, M. H. Lim, K. T. Kang, H. G. Kim, S. Y. Choi, Applied Physics Letters, 89, 022905, 2006], and the like, at a room temperature so as to be used as a gate insulating film.

When the above-mentioned insulating film is deposited at a room temperature, a relatively high dielectric constant value of 10~25 can be obtained but with a high leakage current and low breakdown characteristics. Thus, if voltage of 10V or higher is applied to the insulating film, the insulating film would be broken. Thus, the high dielectric thin films fabricated at the room temperature can be hardly used as a dielectric thin film for a capacitor or a gate insulating film for a transistor.

SUMMARY OF THE INVENTION

Therefore, in order to address the above matters, the various features described herein have been conceived.

One aspect of the present invention is to provide a composite dielectric thin film that can have a high dielectric constant, low leakage current characteristics, and a high breakdown voltage although the composite dielectric thin film is deposited at a room temperature, and its fabrication method.

Another aspect of the present invention is to provide a capacitor having a high dielectric constant by depositing a composite dielectric thin film directly on a plastic substrate of a low glass transition temperature through a room temperature process, and its fabrication method.

Still another aspect of the present invention is to provide a field effect transistor (FET) that can be driven at a low voltage (e.g., at a voltage lower than 5V) by using the composite dielectric thin film as a gate insulating film, and its fabrication method.

(1) This specification provides a composite dielectric thin film deposited at a room temperature or less than 200° C. and comprising crystalline or amorphous insulating filler uniformly distributed within an amorphous dielectric matrix or within an amorphous and partially nanocrystalline dielectric matrix.

(2) This specification also provides a method for fabricating a composite dielectric thin film, including: performing physical vapor deposition on a ceramic target with a composition ratio of $(dielectric)_{1-x}-(filler)_x$ (x=0.1~0.6) at a room temperature or less than 200° C., or simultaneously co-sputtering the dielectric target and the filler target in the same chamber at a room temperature or less than 200° C. to obtain a composite dielectric thin film including crystalline or amorphous insulating filler uniformly distributed within an amorphous dielectric matrix or within an amorphous and partially nanocrystalline dielectric matrix.

(3) A capacitor including first and second electrodes and a dielectric layer interposed between the two electrodes, wherein the dielectric layer is the composite dielectric thin film of (1).

(4) A method for fabricating a capacitor in which a first electrode, a dielectric layer and a second electrode are sequentially formed on a substrate, wherein the dielectric layer is formed by the method for fabricating a composite dielectric thin film of (2).

(5) A field effect transistor (FET) including source, gate and drain electrodes, a channel region acting as a passage allowing carrier to move from the source electrode to the drain electrode therethrough, and a gate insulating film formed between the gate electrode and the channel region, wherein the gate insulating film is the composite dielectric thin film of (1).

(6) A method for fabricating an FET having a gate insulating film, wherein the gate insulating film is formed by using the method for fabricating a composite dielectric thin film of (2).

According to the present invention, a composite dielectric thin film having high dielectric constant, low leakage current, and high breakdown voltage characteristics can be fabricated at a room temperature. The composite dielectric thin film fabricated according to the present invention can have considerably improved leakage current characteristics and can be used as a gate insulating film for a capacitor dielectric layer and a thin film transistor that can be driven at a low voltage.

The foregoing and other objects, features, aspects and advantages of the present invention will become more apparent from the following detailed description of the present invention when taken in conjunction with the accompanying drawings.

DETAILED DESCRIPTION OF THE INVENTION

Exemplary embodiments of the present invention will now be described with reference to FIGS. 1 and 2.

Figure 1:
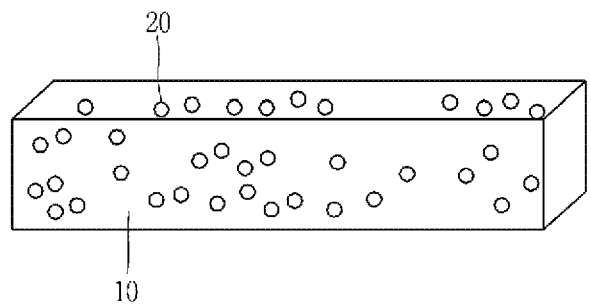
FIGS. 1 and 2 are schematic views showing the structure of a composite dielectric thin film according to an embodiment of the present invention.

With reference to FIG. 1, a composite dielectric thin film according to one embodiment of the present invention is configured such that crystalline or amorphous insulating fillers 20 are uniformly distributed in an amorphous dielectric matrix 10. With reference to FIG. 2, a composite dielectric thin film according to another embodiment of the present invention is configured such that crystalline or amorphous insulating fillers 20' are uniformly distributed in an amorphous dielectric matrix 10' partially containing nanocrystalline material 11'.

In the present invention, the composite dielectric thin film is deposited at a room temperature which refers to temperature of substantially 5° C. to 200° C.

The composite dielectric thin film, preferably, may have a composition ratio of $(\text{dielectric})_{1-x}$–$(\text{filler})_x$ ($x=0.1\sim0.6$). If content of the fillers 20 and 20' in the composite dielectric thin film is smaller than 10 mol %, leakage current reduction characteristics by the fillers 20 and 20' would not be conspicuously observed in the dielectric matrix 10 and 10', and if content of the fillers 20 and 20' in the composite dielectric thin film exceeds 60 mol %, a dielectric constant value of the composite dielectric thin film is drastically degraded.

In the present invention, preferably, a dielectric material of a dielectric constant 10 or higher is used as the dielectric when it is deposited at the room temperature. For example, as the dielectric, one selected from the group consisting of tantalum oxide ($Ta_2O_5$), strontium titanate ($SrTiO_3$), yttrium oxide ($Y_2O_3$), zirconate ($ZrO_2$), barium strontium titanate (($Ba,Sr$)$TiO_3$), barium zirconate titanate (($Ba,Zr$)$TiO_3$), hafnium oxide ($HfO_2$), Alumina ($Al_2O_3$), titanate ($TiO_2$), $Bi_{1.5}Zn_{1.0}Nb_{1.5}O_7$ (BZN), $Bi_2(Zn_{1/3}Nb_{2/3})_2O_7$, $Bi_2InNbO_7$, $Bi_2FeNbO_7$, $Bi_{1.5}Y_{0.5}InNbO_7$, $Bi_{1.5}Y_{0.5}FeNbO_7$, $Bi(Sb,Fe)_2O_7$, $(Bi)_{1-2}(Zn,Nb,Ta,Ti)_2O_7$, $(Ca, Ba, Sr, Pb)_{1-2}(Zn, Nb, Ta, Ti, Zr)_2O_7$, $(Ca_{1-x}Sr_x)Bi_4Ti_4O_{15}$ ($x=0\sim1$), $CaCu_3Ti_4O_{12}$, $SrBi_2Nb_2O_7$, and $Sr(Nb,Ta)_2O_7$ may be used. But the present invention is not limited thereto.

As the filler used in the present invention, a material having a band gap of 7 eV or larger and good insulating characteristics is preferably used. For example, at least one selected from the group consisting of MgO, $Al_2O_3$, $SiO_2$ and $LaAlO_3$ may be used. Of them, MgO has a large band gap of 8 eV and excellent insulating characteristics, but the present invention is not limited thereto.

The most conventional dielectric thin films are obtained through a thin film deposition process at a high temperature of 500° C. or higher. In such a high temperature deposition process, a specific structure of the dielectric thin film (e.g., a perovskite structure in case of ($Ba,Sr$)$TiO_3$, and a pyrochlore structure in case of $Bi_{1.5}Zn_{1.0}Nb_{1.5}O_7$) can be formed, and a high dielectric constant and good leakage current characteristics resulting from the respective crystal structures can be expected.

In comparison, when the high dielectric insulating film is deposited at a room temperature, it has a completely different crystal structure from that of high temperature deposition. When the high dielectric insulating film is deposited at a room temperature, it cannot have sufficient high thermal energy, making it difficult for atoms and ions to spread to generally have an amorphous crystal structure. In case of the amorphous dielectric thin film or a partially crystallized amorphous dielectric thin film, a leakage current is considerably increased at a high applied voltage, and breakdown occurs at a low voltage.

Figure 2:
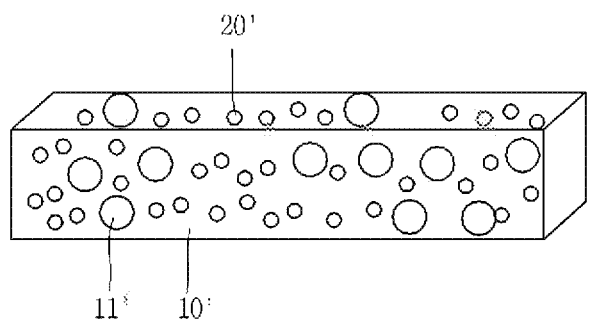

In order to solve the problem, as shown in FIGS. 1 and 2, crystalline or amorphous filler nano particles having good insulating characteristics are uniformly distributed in the amorphous or the partially nanocrystalline amorphous dielectric matrix to restrain a leakage current of the dielectric and thus increase the dielectric breakdown strength. Thus, when the composite dielectric thin film is used as the capacitor dielectric layer and the transistor gate insulating film, a breakdown failure caused by a leakage current can be minimized to thus expect a stable operation of elements.

MgO, $Al_2O_3$, $SiO_2$, $LaAlO_3$ illustrated as fillers in the present invention has a low dielectric constant value of about 4 to 10, which is lower than that (15 to 60) of the dielectric matrix. Thus, for example, in the thin film having the composition of $(\text{dielectric})_{1-x}$–$(\text{filler})_x$ ($x=0.1\sim0.6$), as the content of filler is increased from 10 mol % to 60 mol %, the dielectric constant value is gradually reduced. However, if a dielectric matrix having a sufficiently high dielectric constant can be formed even by a room temperature deposition, although an excessive amount of filler is contained, the composite dielectric thin film may have a high dielectric constant value of 15 or higher.

The method for fabricating the composite dielectric thin film according to the present invention will now be described.

First, in order to fabricate the composite dielectric thin film having the composition of $(\text{dielectric})_{1-x}$–$(\text{filler})_x$ ($x=0.1\sim0.6$), a ceramic target having the composition ratio of $(\text{dielectric})_{1-x}$–$(\text{filler})_x$ ($x=0.1\sim0.6$) is fabricated. The ceramic target can be obtained by mixing dielectric composite powder prepared by a solid state reaction method or the like and 10 mol % to 60 mol % of filler powder over the dielectric composite powder, molding and thermally sintering the resultant material. In detail, the dielectric composite powder may be synthesized by weighing and mixing each power constituting the dielectric according to a desired composition ratio and thermally sintering the resultant material. In this case the ceramic target having the composition of $(\text{dielectric})_{1-x}$–$(\text{filler})_x$ ($x=0.1\sim0.6$) obtained by adding an excessive amount of filler has phase separation characteristics that the filler is precipitated in the dielectric matrix. If a smaller amount of filler, namely, smaller than 10 mol %, is added into the dielectric, the filler is simply substituted into the dielectric position to form a single dielectric structure, and if such target is deposited at a room temperature, only the filler is precipitated or an amorphous matrix without filler is obtained, failing to obtain the effect of leakage current reduction.

Next, the thusly obtained ceramic target undergoes a physical vapor deposition (PVD) process at a room temperature or less than 200° C. The PVD such as pulsed laser deposition (PLD) or sputtering method may be used. The sputtering method allows large-area deposition process, and when the sputtering method is employed, preferably, a process pressure is adjusted to 10 mTorr to 60 mTorr, and when Ar or $O_2$ is used as a process gas, the radio of Ar to $O_2$ is preferably maintained as 10:0~5:5.

In another example, instead of using the ceramic target, a dielectric target containing the dielectric composite power and a filler target containing the filler powder are prepared and simultaneously sputtered within the same chamber at a room temperature or less than 200° C. to fabricate a composite dielectric thin film.

Figure 3:
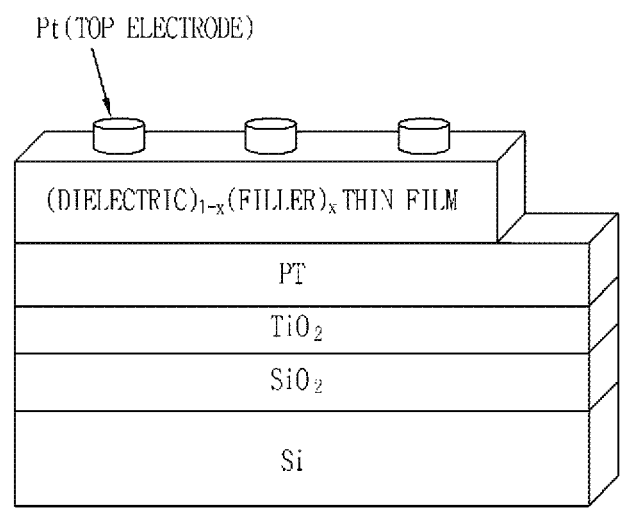
FIG. 3 is a schematic view of a capacitor using a composite dielectric thin film having the composition of (dielectric)$_{1-x}$ (filler)$_x$ (X=0.1~0.6) fabricated according to an embodiment of the present invention as a dielectric layer.

FIG. 3 is a schematic view of a capacitor using the composite dielectric thin film having the composition of $(\text{dielectric})_{1-x}(\text{filler})_x$ ($X=0.1\sim0.6$) fabricated according to an embodiment of the present invention as a dielectric layer.

As shown in FIG. 3, the capacitor according to an embodiment of the present invention has such a structure that a lower electrode Pt, the composite dielectric thin film and an upper electrode Pt are sequentially stacked on the substrate ($TiO_2$/$SiO_2$/Si substrate). The thickness of the composite dielectric thin film is preferably 100 nm to 1000 nm.

Because the composite dielectric thin film for a capacitor according to an embodiment of the present invention is formed by a room temperature deposition process of a room temperature or less than 200° C., besides the silicon substrate with the insulating film formed thereon, a plastic substrate (including a transparent plastic substrate) or a glass substrate may be also used as the substrate. As the upper and lower electrodes, Au, Pd, Cu, Ni, Cr, Mo, Al or transparent conductive oxide electrode (e.g., ITO or FTO) may be used besides the Pt electrode.

Figure 4:
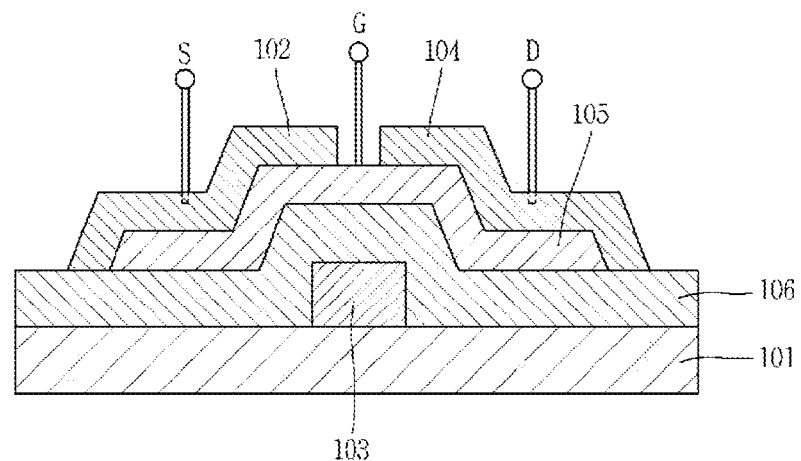
FIGS. 4 and 5 are sectional views of thin film transistor (field effect transistor) using the composite dielectric thin film having the composition of (dielectric)$_{1-x}$(filler)$_x$ (X=0.1~0.6) fabricated according to an embodiment of the present invention as a gate insulating film.
Figure 5:
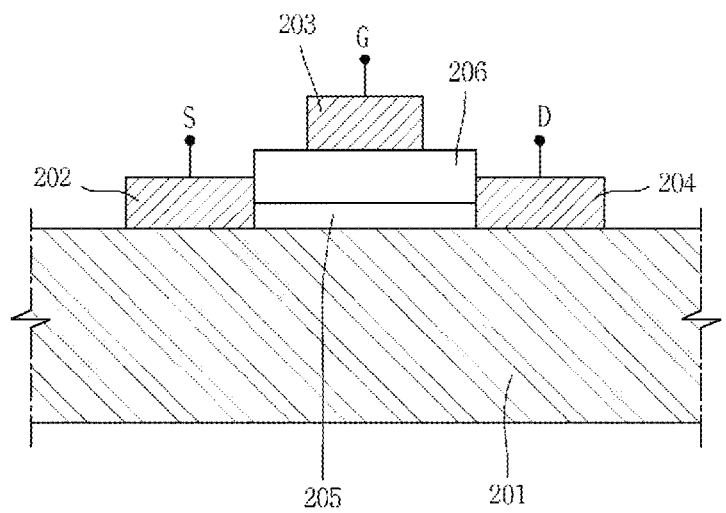

FIGS. 4 and 5 are sectional views of thin film transistor (field effect transistor) using the composite dielectric thin film having the composition of $(\text{dielectric})_{1-x}(\text{filler})_x$ (X=0.1~0.6) fabricated according to an embodiment of the present invention as a gate insulating film.

With reference to FIGS. 4 and 5, the FET according to an embodiment of the present invention includes source electrodes 102 and 202, gate electrodes 103 and 203, and drain electrodes 104 and 204, channel regions 105 and 205, a passage through which carriers coming from the source electrodes move to the drain electrodes, and gate insulating films 106 and 206 formed between the gate electrodes and the channel regions, wherein the above-mentioned $(\text{dielectric})_{1-x}$ $(\text{filler})_x$ (X=0.1~0.6) is used as the gate insulating film. Here, the gate insulating film has a thickness of 100 nm to 1000 nm, and such TFT may be configured according to the bottom gate method (See FIG. 4) or a top gate method (See FIG. 5).

The gate insulating film for a TFT according to the present invention is formed by a deposition process at a room temperature or less than 200° C., so plastic substrate (including transparent plastic substrate), glass substrate, or a silicon substrate with an insulating film formed thereon may be used as the substrates 101 and 201 with the TFT having such structure formed thereon. The channel region may include organic semiconductor or oxide semiconductor, for example, ZnO, $SnO_2$, $In_2O_3$, or ZnO doped with In and Ga. Pt, Au, Pd, Cu, Ni, Cr, Mo, Al, or a transparent conductive oxide electrode and the like may be used as the source, gate and drain electrodes.

The embodiments of the present invention will now be described in detail. The embodiments are proposed to help understand the present invention, not to limit the scope of the present invention, and the present invention will be determined with a technical idea of claims to be described.

[Embodiment 1] $(Ba_{0.6}Sr_{0.4}TiO_3)_{1-x}$—$(MgO)_x$ (x=0.1~0.3) Composite Dielectric Thin Film Using a PLD Method and Fabrication of Capacitor Using the Same First, in order to prepare powder having a composition of $Ba_{0.6}Sr_{0.4}TiO_3$, powder of $BaCO_3$, $SrCO_3$, $TiO_2$ was weighted according to a composition ratio of $Ba_{0.6}Sr_{0.4}TiO_3$, and the weighted powder of $BaCO_3$, $SrCO_3$, $TiO_2$ was mixed in an ethanol solvent through ball milling for 24 hours. At this time, zirconia ball was used in performing ball milling. In a $Ba_{0.6}Sr_{0.4}TiO_3$ dielectric, as the ratio of [Ba] and [Sr], other composition ratio than that of 0.6:0.4 used in this embodiment may be used, and there is no restriction to a particular composition ratio. Subsequently, the mixed powder was dried and thermally treated at 1200° C. for three hours to synthesize $Ba_{0.6}Sr_{0.4}TiO_3$ powder.

Thereafter, 10 mol %, 20 mol %, and 30 mol % of MgO was added to the synthesized $Ba_{0.6}Sr_{0.4}TiO_3$ powder, on which zirconia ball milling was performed for 24 hours, and the resultant material was mixed, dried, molded and thermally treated to fabricate a 1-inch sized ceramic target having a composition of $(Ba_{0.6}Sr_{0.4}TiO_3)_{1-x}$—$(MgO)_x$ (x=0.1~0.3). Finally, the ceramic target was sintered at 1400° C. for five hours to complete fabrication of the PLD target.

And then, a composite dielectric thin film having a thickness of 200 nm was formed through a PLD method at a room temperature by using the target having the composition of $(Ba_{0.6}Sr_{0.4}TiO_3)_{1-x}$—$(MgO)_x$ (x=0.1~0.3) as obtained. At this time, beam energy was 1.0 J/cm², an oxygen pressure was 10 mTorr, and a pulse repetition rate was 20 Hz. The dielectric characteristics were measured and analyzed at a frequency of 1 MHz by using an HP4192 impedance analyzer, and leakage current and dielectric breakdown characteristics were measured by using an HP4145B semiconductor parameter analyzer.

In order to evaluate electrical characteristics of the composite dielectric thin film, a metal-insulator-metal (MIM) capacitor was formed. In detail, platinum (Pt) was deposited with a thickness of 100 nm as a lower electrode on the $TiO_2$ (50 nm)/$SiO_2$/Si substrate, a composite dielectric thin film was formed with a thickness of 200 nm on the lower electrode by using the PLD method, and an upper electrode(Pt) as a circular dot having a size of $3.14 \times 10^{-4}$ cm² was formed on the composite dielectric thin film by using a shadow mask (See FIG. 3). At this time, the composite dielectric thin film has a composition of $(Ba_{0.6}Sr_{0.4}TiO_3)_{1-x}$—$(MgO)_x$ (x=0.1~0.3).

Meanwhile, for a comparison of the leakage current characteristics and dielectric constant value, a pure $Ba_{0.6}Sr_{0.4}TiO_3$ target without MgO was prepared and deposited in the same manner as described above.

Figure 6:
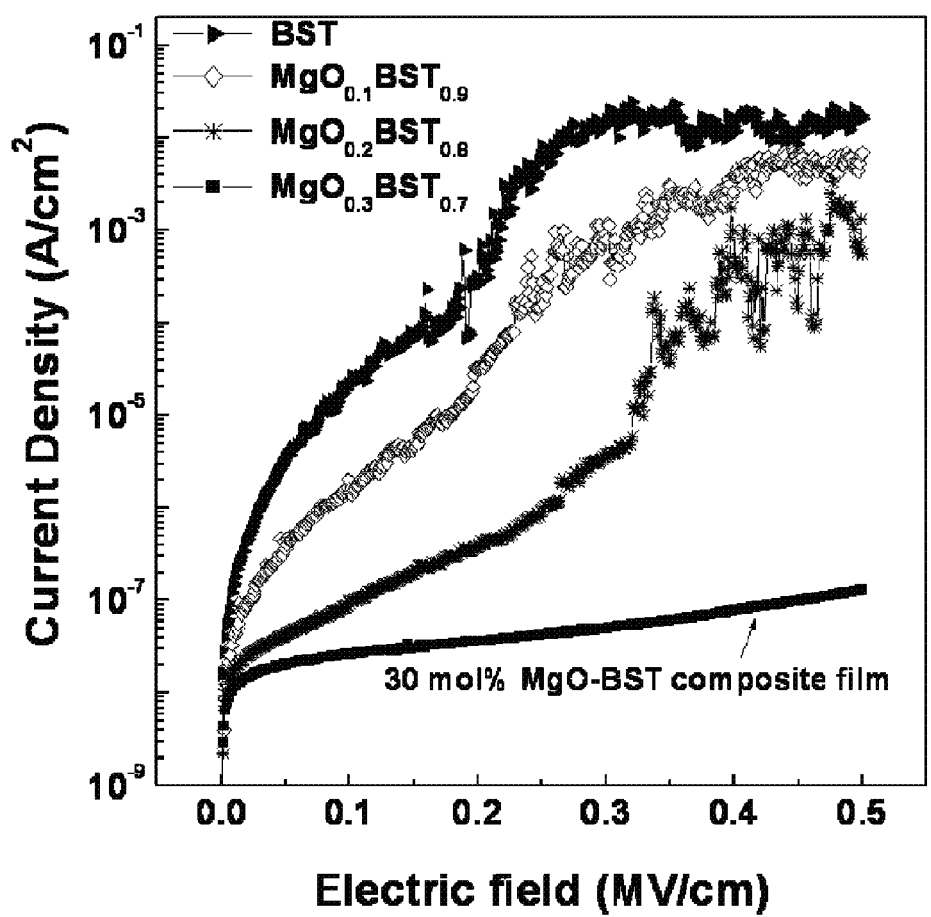
FIG. 6 is a graph of leakage current characteristics over voltage applied to a thin film of $(Ba_{0.6}Sr_{0.4}TiO_3)_{1-x}$—$(MgO)_x$ (x=0.1~0.3) deposited by a PLD method at a room temperature according to a first embodiment of the present invention.

FIG. 6 is a graph of leakage current characteristics over voltage applied to the thin film of $(Ba_{0.6}Sr_{0.4}TiO_3)_{1-x}$—$(Mg)_x$ (x=0.1~0.3) deposited by the PLD method at a room temperature according to a first embodiment of the present invention. As shown in FIG. 6, it is noted that the $Ba_{0.6}Sr_{0.4}TiO_3$ (BST) thin film without MgO has a current density of about $10^{-5}$ A/cm² until when an applied voltage reaches 0.1 MV/cm, and as the applied voltage is additionally increased, breakdown occurs. In comparison, the $(Ba_{0.6}Sr_{0.4}TiO_3)_{1-x}$—$(MgO)_x$ (x=0.1~0.3) thin films each containing 10 mol %, 20 mol %, and 30 mol % of MgO have a considerably reduced leakage current density and improved dielectric breakdown characteristics. These results are obtained by forming the composite dielectric thin film by MgO having good dielectric breakdown characteristics along with $Ba_{0.6}Sr_{0.4}TiO_3$. In particular, in case of $(Ba_{0.6}Sr_{0.4}TiO_3)_{1-x}$—$(MgO)_x$ (x=0.3) composite dielectric thin film containing 30 mol % of MgO, it exhibits low leakage current density characteristics of $10^{-7}$ A/cm² at an electric field of 0.5 MV/cm.

Figure 7:
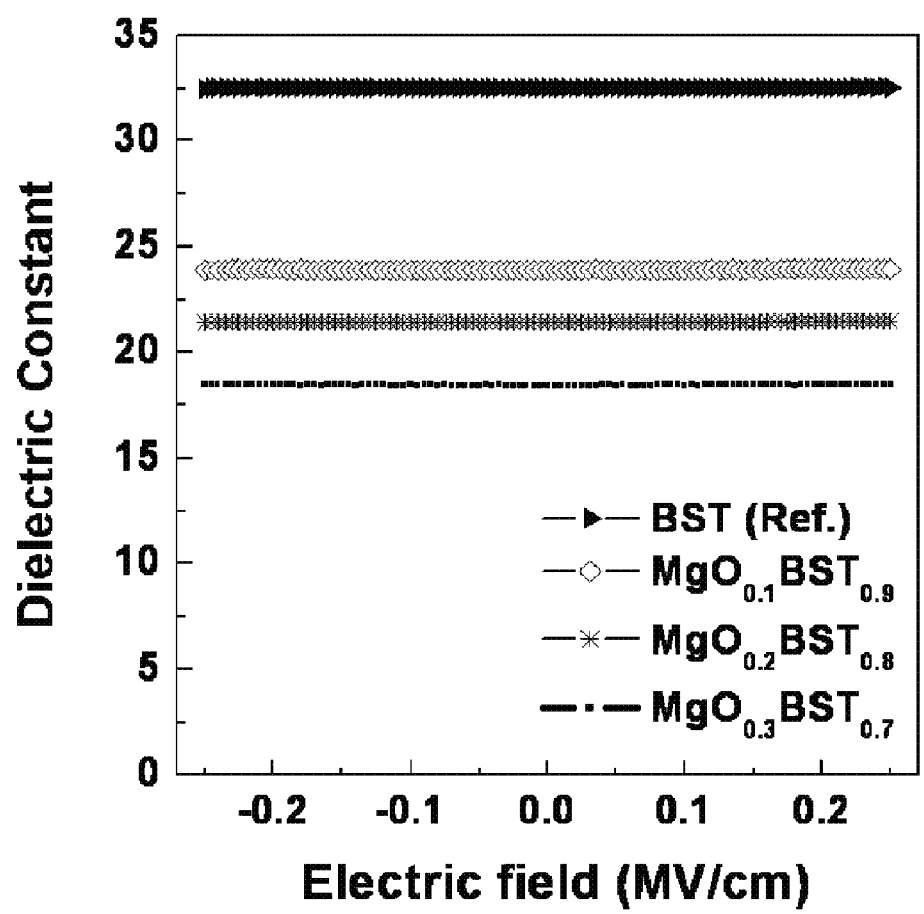
FIG. 7 is a graph of dielectric characteristics over voltage applied to a thin film of $(Ba_{0.6}Sr_{0.4}TiO_3)_{1-x}$—$(MgO)_x$ (x=0.1~0.3) deposited by a PLD method at a room temperature according to the first embodiment of the present invention.

FIG. 7 is a graph of dielectric characteristics over voltage applied to a thin film of $(Ba_{0.6}Sr_{0.4}TiO_3)_{1-x}$—$(MgO)_x$ (x=0.1~0.3) deposited by the PLD method at a room temperature according to the first embodiment of the present invention. The $Ba_{0.6}Sr_{0.4}TiO_3$ thin film without MgO has a dielectric constant value of about 32.5. Although the pure $Ba_{0.6}Sr_{0.4}TiO_3$ thin film deposited at the room temperature has a relatively high dielectric constant value, it has a high leakage current value as shown in FIG. 6, so there is a restriction in directly using the $Ba_{0.6}Sr_{0.4}TiO_3$ as a gate insulating film for the capacitor dielectric layer and TFT. Meanwhile, the $(Ba_{0.6}Sr_{0.4}TiO_3)_{1-x}$—$(MgO)_x$ (x=0.1~0.3) composite dielectric thin films each containing 10 mol %, 20 mol %, and 30 mol % of MgO have such characteristics that the dielectric constant values are reduced to 24, 22 and 18 as the content of MgO increases. Although the $(Ba_{0.6}Sr_{0.4}TiO_3)_{1-x}$—$(MgO)_x$ (x=0.3) composite dielectric thin film containing 30 mol % of MgO has the dielectric constant value of 18, it is a relatively high dielectric constant obtained in the room temperature deposition process compared with the $SiO_2$ and $Si_3N_4$ thin films utilized for an active matrix liquid crystal display (AM-LCD) and an active matrix organic lighting emitting diode (AMOLED) and having a dielectric constant value of 4~7.

[Embodiment 2] $(Ba_{0.6}Sr_{0.4}TiO_3)_{1-x}$—$(MgO)_x$ (x=0.2~0.3) Composite Dielectric Thin Film Using a Sputtering Method and Fabrication of Capacitor Using the Same After $Ba_{0.6}Sr_{0.4}TiO_3$ powder was synthesized in the same manner as in the above-described Embodiment 1, to which 20 mol % and 30 mol % of MgO were added, respectively. Zirconia ball milling was performed on the resultant material for 24 hours, and then, mixing, drying, molding and thermally treating process were performed to obtain a 2-inch ceramic target having a composition of $(Ba_{0.6}Sr_{0.4}TiO_3)_{1-x}$—$(MgO)_x$ (x=0.2~0.3). Finally, the ceramic target was sintered at 1400° C. for five hours to complete the fabrication of a sputtering target.

Next, a composite dielectric thin film having a thickness of 300 nm was formed at a room temperature by using the obtained target having the composition of $(Ba_{0.6}Sr_{0.4}TiO_3)_{1-x}$—$(MgO)_x$ (x=0.2~0.3). At this time, RF power was 80W, the process pressure was changed from 10 mTorr to 60 mTorr, and Ar and $O_2$, the process gases, were changed at $Ar/O_2$ ratio of 10:0~5:5.

In order to evaluate electrical characteristics of the composite dielectric thin film, an MIM capacitor was fabricated. In detail, plutonium (Pt) was deposited with a thickness of 100 nm as a lower electrode on the $TiO_2$(50 nm)/$SiO_2$/Si substrate, a composite dielectric thin film was formed with a thickness of 300 nm on the lower electrode by using a sputtering method, and an upper electrode as a circular dot having a size of $3.14 \times 10^{-4}$ $cm^2$ was formed on the composite dielectric thin film by using a shadow mask (See FIG. 3). At this time, the composite dielectric thin film has a composition of $(Ba_{0.6}Sr_{0.4}TiO_3)_{1-x}$—$(MgO)_x$ (x=0.2~0.3).

Meanwhile, for a comparison of the leakage current characteristics and dielectric constant value, a $Ba_{0.6}Sr_{0.4}TiO_3$ target without MgO was prepared and deposited in the same manner as described above.

Figure 8:
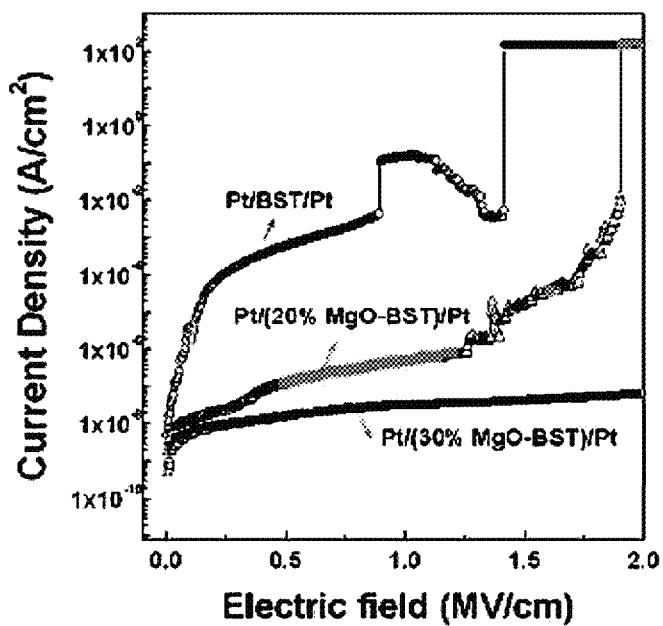
FIG. 8 is a graph of leakage current characteristics over voltage applied to a composite dielectric thin film of $(Ba_{0.6}Sr_{0.4}TiO_3)_{0.8}$—$(MgO)_{0.5}$ and $(Ba_{0.6}Sr_{0.4}TiO_3)_{0.7}$—$(Mg)_{0.3}$ deposited by a sputtering method at a room temperature according to a second embodiment of the present invention.

FIG. 8 is a graph of leakage current characteristics over voltage applied to a composite dielectric thin film of $(Ba_{0.6}Sr_{0.4}TiO_3)_{0.8}$—$(MgO)_{0.2}$ and $(Ba_{0.6}Sr_{0.4}TiO_3)_{0.7}$—$(MgO)_{0.3}$ deposited by the sputtering method at a room temperature according to a second embodiment of the present invention. Like the characteristics of the $(Ba_{0.6}Sr_{0.4}TiO_3)_{1-x}$—$(MgO)_x$ (x=0.1~0.3) composite dielectric thin film fabricated according to PLD, the composite dielectric thin film having the composition of $(Ba_{0.6}Sr_{0.4}TiO_3)_{0.8}$—$(MgO)_{0.2}$ and $(Ba_{0.6}Sr_{0.4}TiO_3)_{0.7}$—$(MgO)_{0.3}$ fabricated according to sputtering has the good leakage current characteristics. In particular, the 30 mol % MgO-added composite dielectric thin film exhibits low leakage current density characteristics of $10^{-8}$ $A/cm^2$ and high dielectric breakdown strength characteristics even at an electric field of 2 MV/cm.

Figure 9:
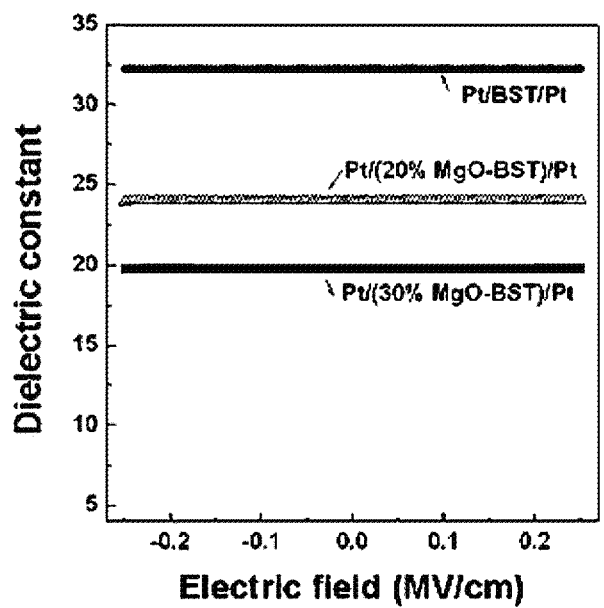
FIG. 9 is a graph of dielectric characteristics over voltage applied to a composite dielectric thin film of $(Ba_{0.6}Sr_{0.4}TiO_3)_{0.8}$—$(MgO)_{0.2}$ and $(Ba_{0.6}Sr_{0.4}TiO_3)_{0.7}$-$(MgO)_{0.3}$ deposited by a sputtering method at a room temperature according to a second embodiment of the present invention.

FIG. 9 is a graph of dielectric characteristics over voltage applied to a composite dielectric thin film of $(Ba_{0.6}Sr_{0.4}TiO_3)_{0.8}$—$(MgO)_{0.2}$ and $(Ba_{0.6}Sr_{0.4}TiO_3)_{0.7}$—$(MgO)_{0.3}$ deposited by a sputtering method at a room temperature according to a second embodiment of the present invention. The $Ba_{0.6}Sr_{0.4}TiO_3$ thin film without MgO has a dielectric constant value of about 32.2. In comparison, the $(Ba_{0.6}Sr_{0.4}TiO_3)_{1-x}$—$(MgO)_x$ (x=0.2~0.3) composite dielectric thin films containing 20 mol % and 30 mol % of MgO have such characteristics that the dielectric constant values are reduced to 24 and 20 as the content of MgO increases. Because the dielectric constant value of the dielectric thin film, particularly, the 30 mol % MgO-added $(Ba_{0.6}Sr_{0.4}TiO_3)_{1-x}$—$(MgO)_x$ (x=0.3) composite dielectric thin film, deposited at the room temperature by using the sputtering process is 20, sufficiently high, it can be applied as a dielectric layer of a capacitor and a gate insulating film of a TFT that can be directly fabricated on the plastic substrate.

Figure 10:
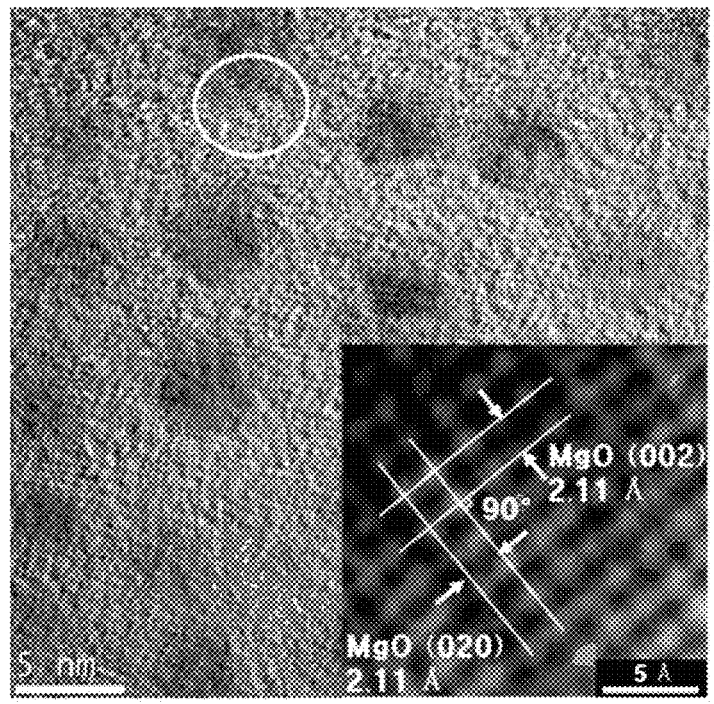
FIGS. 10 and 11 are transmission electronic microscope (TEM) photograph images of crystal structure of the composite dielectric thin film of $(Ba_{0.6}Sr_{0.4}TiO_3)_{1-x}$—$(MgO)_x$ (x=0.3) and the pure $Ba_{0.6}Sr_{0.4}TiO_3$ thin film deposited by the sputtering method at a room temperature according to the second embodiment of the present invention.
Figure 11:
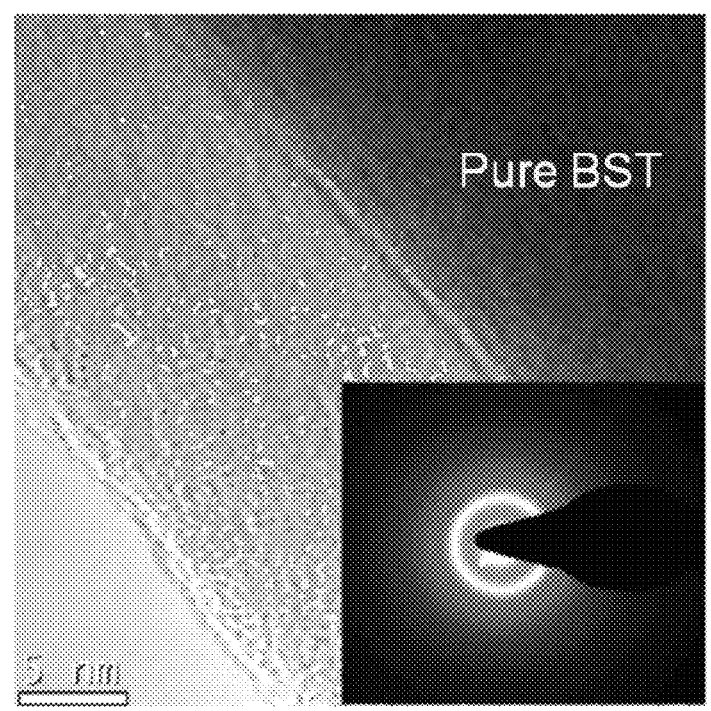

FIGS. 10 and 11 are transmission electronic microscope (TEM) photograph images of crystal structure of the composite dielectric thin film of $(Ba_{0.6}Sr_{0.4}TiO_3)_{1-x}$—$(MgO)_x$ (x=0.3) and the pure thin film of $Ba_{0.6}Sr_{0.4}TiO_3$ deposited by the sputtering method at a room temperature according to the second embodiment of the present invention. As shown in FIG. 10, nanocrystals are partially observed in the amorphous matrix, showing that $(Ba_{0.6}Sr_{0.4}TiO_3)$ forms the amorphous matrix in the $(Ba_{0.6}Sr_{0.4}TiO_3)_{1-x}$—$(MgO)_x$ (x=0.3) composite dielectric thin film, and MgO forms ultrafine nanocrystals and uniformly distributed in the amorphous $(Ba_{0.6}Sr_{0.4}TiO_3)$ matrix. An inset photograph at a lower end of right side is an enlarged photograph of the TEM, in which respective faces meet perpendicularly at the distance of 2.11 Å. It is the same as MgO having the interface distance of 2.11 Å as (002) face and (020) face perpendicular to each other, so the nanocrystals are MgO. Because MgO has good insulation characteristics, it improves the leakage current characteristics of the dielectric having the amorphous structure. FIG. 11 shows the TEM results of the dielectric thin film obtained by depositing pure $Ba_{0.6}Sr_{0.4}TiO_3$ at the room temperature by using the sputtering method, from which it is noted that the dielectric thin film has the amorphous structure. When a ceramic target is formed by adding MgO of less than 5 mol % into the pure $Ba_{0.6}Sr_{0.4}TiO_3$, Mg is substituted as an acceptor into the position of Ti to form the target having a single perovskite structure. When the target is deposited at a room temperature, an amorphous dielectric thin film is formed having a structure different from the case (See FIG. 10) where MgO is precipitated in the amorphous dielectric matrix.

As noted from the TEM results of FIGS. 10 and 11, the (dielectric) portion of the thin film having the composition of $(dielectric)_{1-x}(MgO)_x$ (X=0.1~0.6) forms the matrix and (MgO) forms the nanocrystals. MgO may be distributed in the amorphous from or crystallized form in the dielectric according to types of used dielectrics.

[Embodiment 3] $(Bi_{1.5}Zn_{1.0}Nb_{1.5}O_7)_{1-x}$—$(MgO)_x$ (x=0.1~0.3) Composite Dielectric Thin Film Using the PLD Method and Fabrication of Capacitor Using the Same First, in order to prepare powder having a composition of $Bi_{1.5}Zn_{1.0}Nb_{1.5}O_7$, powder of $Bi_2O_3$, ZnO, $Nb_2O_5$ was weighted according to a composition ratio of $Bi_{1.5}Zn_{1.0}Nb_{1.5}O_7$, and the weighted $Bi_2O_3$, ZnO, $Nb_2O_5$ powder was mixed in an ethanol solvent through ball milling for 24 hours. At this time, zirconia ball was used for the ball milling. Subsequently, the mixed powder was dried and thermally treated at 900° C. for three hours to synthesize $Bi_{1.5}Zn_{1.0}Nb_{1.5}O_7$.

Next, 10 mol %, 20 mol % and 30 mol % of MgO were added to the synthesized $Bi_{1.5}Zn_{1.0}Nb_{1.5}O_7$ powder, respectively, on which zirconia ball milling was performed for 24 hours. The resultant material was mixed, dried, molded and thermally treated to fabricated 1-inch ceramic target having a composition of $(Bi_{1.5}Zn_{1.0}Nb_{1.5}O_7)_{1-x}$—$(MgO)_x$ (x=0.1~0.3). Finally, the ceramic target was sintered at 1100° C. for three hours to complete the fabrication of the PLD target.

And then, a composite dielectric thin film having a thickness of 200 nm was formed at a room temperature through the PLD method by using the obtained target having the composition of $(Bi_{1.5}Zn_{1.0}Nb_{1.5}O_7)_{1-x}$—$(MgO)_x$ (x=0.1~0.3). At this time, beam energy was 1.0 $J/cm^2$, oxygen partial pressure was 10 mTorr, and a pulse speed was 20 Hz.

In order to evaluate electrical characteristics of the composite dielectric thin film, a metal-insulator-metal (MIM) capacitor was formed. In detail, platinum (Pt) was deposited with a thickness of 100 nm as a lower electrode on the $TiO_2$ (50 nm)/$SiO_2$/Si substrate, a composite dielectric thin film was formed with a thickness of 200 nm on the lower electrode by using the PLD method, and an upper electrode as a circular dot having a size of $3.14 \times 10^{-4}$ $cm^2$ was formed on the composite dielectric thin film by using a shadow mask (See FIG.

3). At this time, the composite dielectric thin film has a composition of $(Bi_{1.5}Zn_{1.0}Nb_{1.5}O_7)_{1-x}$—$(MgO)_x$ (x=0.1~0.3).

Figure 12:
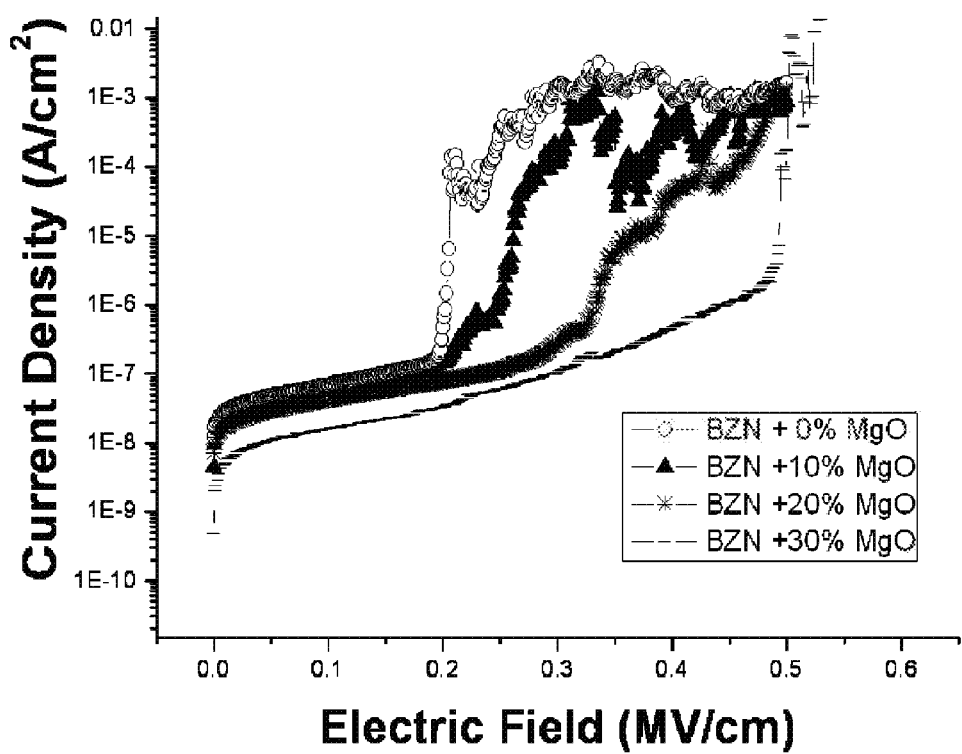
FIG. 12 is a graph of leakage current characteristics over voltage applied to the composite dielectric thin film fabricated according to a third embodiment of the present invention.

FIG. 12 is a graph of leakage current characteristics over voltage applied to the composite dielectric thin film fabricated according to a third embodiment of the present invention. As shown in FIG. 12, it is noted that the $Bi_{1.5}Zn_{1.0}Nb_{1.5}O_7$ (BZN) thin film without MgO has a current density of about $10^{-7}$ A/cm$^2$ until when an applied voltage reaches 0.2 MV/cm, and when the applied voltage is additionally increased, breakdown occurs. In comparison, composite dielectric thin films having a composition of $(Bi_{1.5}Zn_{1.0}Nb_{1.5}O_7)_{1-x}$—$(MgO)_x$ (x=0.1~0.3) each containing 10 mol %, 20 mol % and 30 mol % of MgO has a low current density value over a relatively high applied voltage and has improved dielectric breakdown characteristics. These results are obtained by forming the composite dielectric thin films together with $Bi_{1.5}Zn_{1.0}Nb_{1.5}O_7$ containing the excessive amount of MgO having good insulation characteristics.

Figure 13:
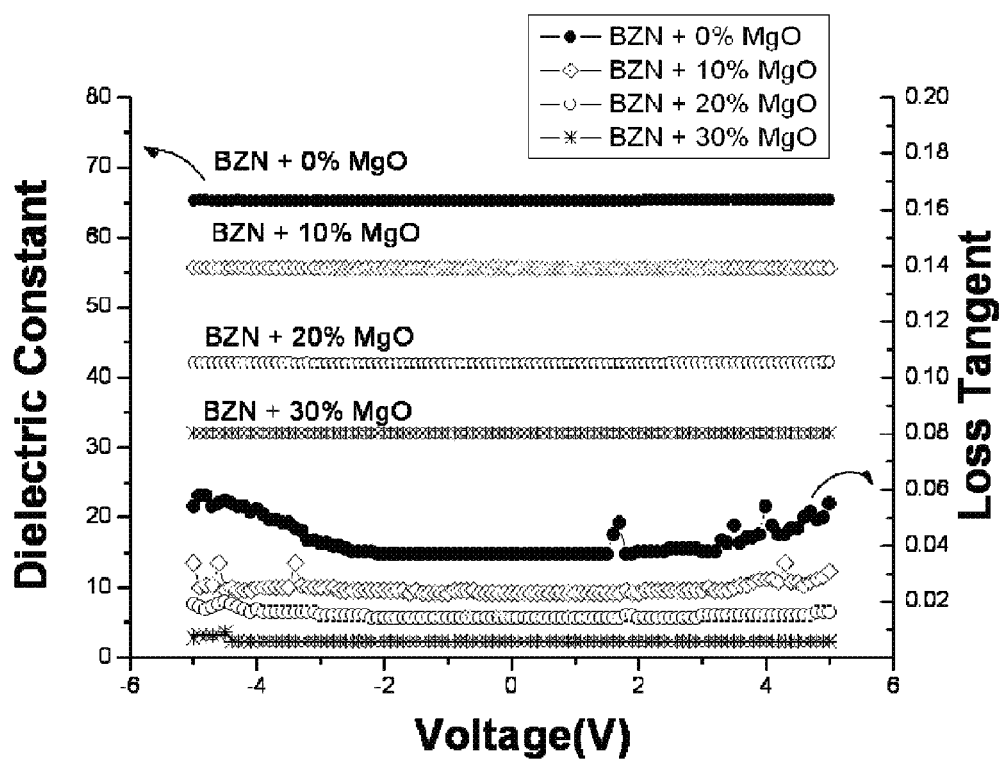
FIG. 13 is a graph of dielectric characteristics over voltage applied to the composite dielectric thin film fabricated according to the third embodiment of the present invention.

FIG. 13 is a graph of dielectric characteristics over voltage applied to the composite dielectric thin film fabricated according to the third embodiment of the present invention. As shown in FIG. 13, the $Bi_{1.5}Zn_{1.0}Nb_{1.5}O_7$(BZN) thin film without MgO has a dielectric constant value of about 65. Meanwhile, the composite dielectric thin films having the composition of $(Bi_{1.5}Zn_{1.0}Nb_{1.5}O_7)_{1-x}$—$(MgO)_x$ (x=0.1~0.3) each containing 10 mol %, 20 mol %, and 30 mol % of MgO have dielectric constant values of 55, 42 and 32, respectively. Compared with the $SiO_2$ and $Si_3N_4$ thin films utilized as the gate insulating film in the AMLCD and the AMOLED and having the dielectric constant values of about 4-7, the fact that the composition dielectric thin films deposited at the room temperature and having the composition of $(Bi_{1.5}Zn_{1.0}Nb_{1.5}O_7)_{1-x}$—$(MgO)_x$ (x=0.1~0.3) have the dielectric constant values of 55, 42 and 32 verifies that the composite dielectric thin films have the considerably good dielectric characteristics.

Meanwhile, among the composite dielectric thin films having the composition of $(Bi_{1.5}Zn_{1.0}Nb_{1.5}O_7)_{1-x}$—$(MgO)_x$ (x=0.1~0.3), it is noted that the dielectric thin film containing 30 mol % of MgO has the best leakage current characteristics. In addition, because a corresponding dielectric constant value is distributed by about 32, it can be sufficiently applied as a gate insulating film for a transistor driven at a low voltage of 5V or lower.

[Embodiment 4] $(Bi_{1.5}Zn_{1.0}Nb_{1.5}O_7)_{1-x}$—$(MgO)_x$ (x=0.3) Composite Dielectric Thin Film Using the PLD Method and Fabrication of Capacitor Using the Same A 3-inch target having a composition of $(Bi_{1.5}Zn_{1.0}Nb_{1.5}O_7)_{1-x}$—$(MgO)_x$ (x=0.3) was prepared, and a composite dielectric thin film having a thickness of 200 nm was formed at a room temperature by using an RF magnetron sputtering method. At this time, RF power was 85W, the process pressure was changed from 10 mTorr to 50 mTorr, and Ar and $O_2$, the process gases, were changed at Ar/$O_2$ ratios of 16:4, 12:8 and 10:10.

In addition, in order to evaluate electrical characteristics of the composite dielectric thin film, an MIM capacitor was fabricated. In detail, platinum (Pt) was deposited with a thickness of 100 nm as a lower electrode on the $TiO_2$(50 nm)/$SiO_2$/Si substrate, a composite dielectric thin film was formed with a thickness of 200 nm on the lower electrode by using the PLD method, and an upper electrode as a circular dot having a size of $3.14 \times 10^{-4}$ cm$^2$ was formed on the composite dielectric thin film by using a shadow mask (See FIG. 3). At this time, the composite dielectric thin film has a composition of $(Bi_{1.5}Zn_{1.0}Nb_{1.5}O_7)_{1-x}$—$(MgO)_x$ (x=0.3).

Figure 14:
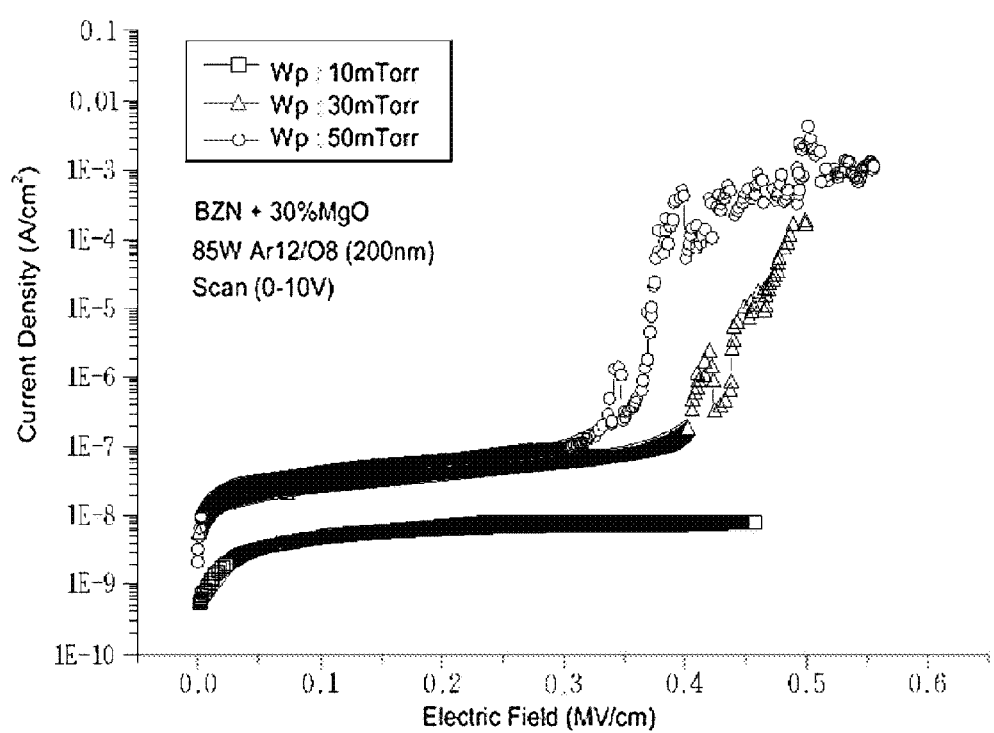
FIG. 14 is a graph of leakage current characteristics over voltage applied to the composite dielectric thin film having the composition of $(Bi_{1.5}Zn_{1.0}Nb_{1.5}O_7)_{0.7}$—$(MgO)_{0.3}$ fabricated according to a fourth embodiment of the present invention.

FIG. 14 is a graph of leakage current characteristics over voltage applied to the composite dielectric thin film having the composition of $(Bi_{1.5}Zn_{1.0}Nb_{1.5}O_7)_{0.7}$—$(MgO)_{0.3}$ fabricated according to a fourth embodiment of the present invention. For reference, in the fourth embodiment of the present invention, the composite dielectric thin film having the composition of $(Bi_{1.5}Zn_{1.0}Nb_{1.5}O_7)_{0.7}$—$(MgO)_{0.3}$ was formed by using the sputtering method, and the reason for forming the composite dielectric thin film by using the sputtering method is to confirm easiness of forming the composite dielectric thin film with a large area. As mentioned above, Ar/$O_2$ ratio was changed to 16:4, 12:8, and 10:10. Among them, the Ar/$O_2$ ratio of 12:8 shows low leakage current characteristics, and the process pressure has lower leakage current characteristics at 10 mTorr, rather than at 50 mTorr. Such result shows that like the composite dielectric thin film fabricated according to the Embodiment 3 as described above, the composite dielectric thin film fabricated according to Embodiment 4 also has good leakage current characteristics.

Figure 15:
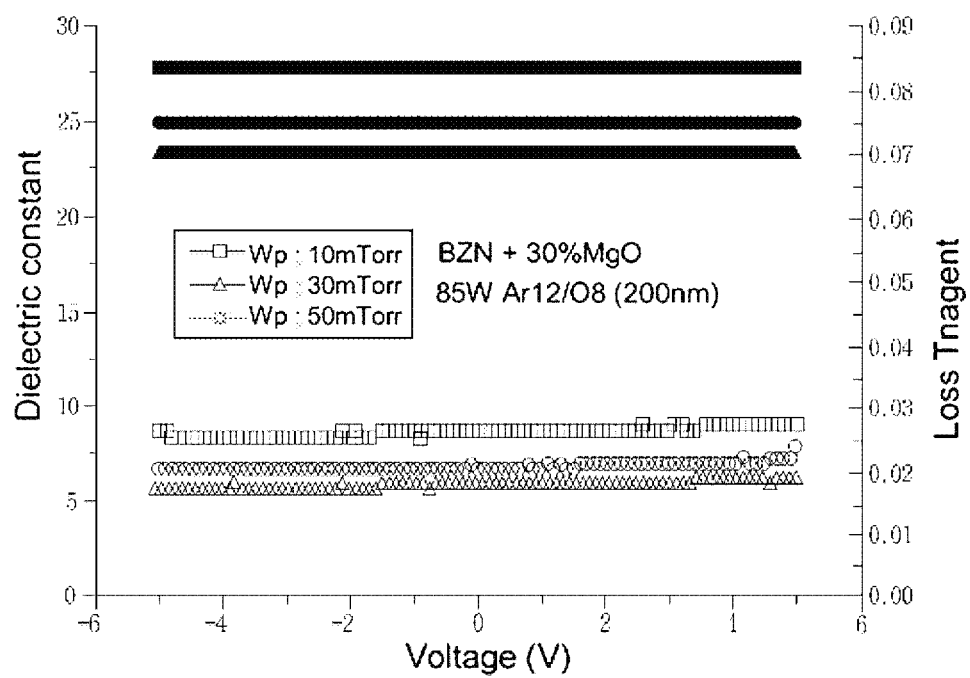
FIG. 15 is a graph of dielectric characteristics over voltage applied to the composite dielectric thin film having the composition of $(Bi_{1.5}Zn_{1.0}Nb_{1.5}O_7)_{0.7}$—$(MgO)_{0.3}$ fabricated according to the fourth embodiment of the present invention.

FIG. 15 is a graph of dielectric characteristics over voltage applied to the composite dielectric thin film having the composition of $(Bi_{1.5}Zn_{1.0}Nb_{1.5}O_7)_{0.7}$—$(MgO)_{0.3}$ fabricated according to the fourth embodiment of the present invention. In a state that the Ar/$O_2$ ratio was fixed at 12:8, as the process pressure was changed from 50 mTorr to 30 mTorr and to 10 mTorr, dielectric constant values were improved to 23, 25, and 27. Compared with the results of Embodiment 3, it is noted that the composite dielectric thin film deposited by the PLD method according to Embodiment 3 has slight better dielectric constant characteristics than the composite dielectric thin film deposited by the sputtering method according to Embodiment 4. In the sputtering deposition, the $(Bi_{1.5}Zn_{1.0}Nb_{1.5}O_7)_{0.7}$—$(MgO)_{0.3}$ thin film has a high dielectric constant value, i.e., 20 or higher, so there is a high possibility that it can be utilized as a dielectric layer for a capacitor and a gate insulating film for a transistor.

Figure 16:
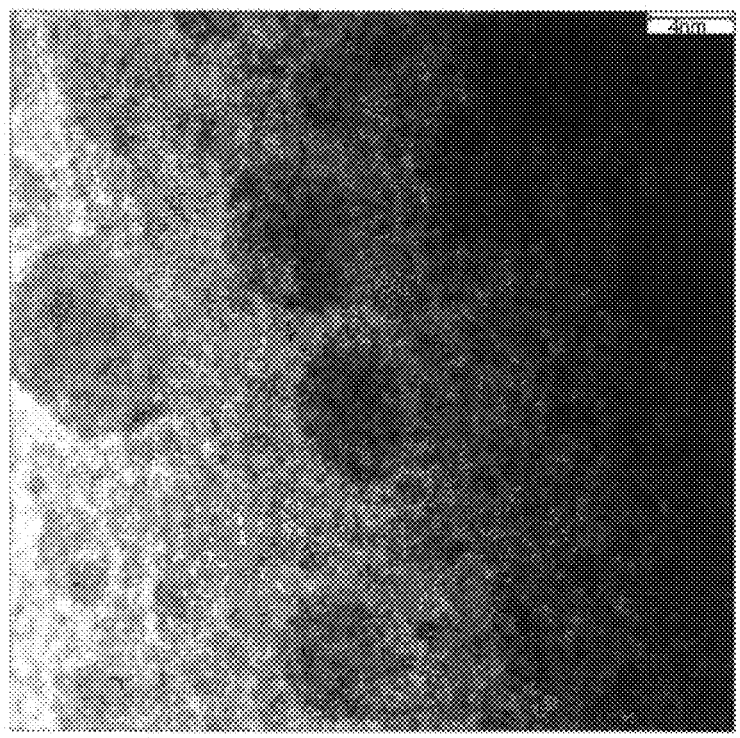
FIG. 16 is a TEM photograph image of a crystal structure of the composite dielectric thin film having the composition of $(Bi_{1.5}Zn_{1.0}Nb_{1.5}O_7)_{0.7}$—$(MgO)_{0.3}$ fabricated according to the fourth embodiment of the present invention.
Figure 17:
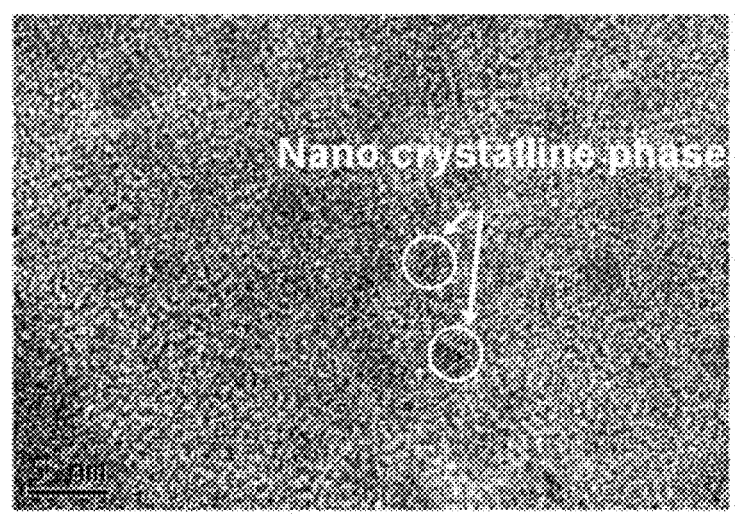
FIG. 17 shows a TEM photograph image of a pure $Bi_{1.5}Zn_{1.0}Nb_{1.5}O_7$ thin film.

FIG. 16 is a TEM photograph image of a crystal structure of the composite dielectric thin film having the composition of $(Bi_{1.5}Zn_{1.0}Nb_{1.5}O_7)_{0.7}$—$(MgO)_{0.3}$ fabricated according to the fourth embodiment of the present invention. As shown in FIG. 16, nanocrystals of $Bi_{1.5}Zn_{1.0}Nb_{1.5}O_7$ are partially observed, and it is noted that partially amorphous $Bi_{1.5}Zn_{1.0}Nb_{1.5}O_7$ and amorphous or crystalline MgO are mixed. In comparison, FIG. 17 shows a TEM photograph image of a pure $Bi_{1.5}Zn_{1.0}Nb_{1.5}O_7$ thin film, in which $Bi_{1.5}Zn_{1.0}Nb_{1.5}O_7$ thin film crystals having a size of 5 nm or smaller are partially observed. As shown in FIGS. 16 and 17, because the fillers are uniformly distributed in the dielectric matrix having the amorphous and partially crystalline mixture, the leakage current characteristics can be significantly improved.

[Embodiment 5] Fabrication of Transistor Using $(Ba_{0.6}Sr_{0.4}TiO_3)_{0.7}$—$(MgO)_{0.3}$ Composite Dielectric Thin Film as Gate Insulating Film on Plastic Substrate In order to demonstrate the superiority of the $(Ba_{0.6}Sr_{0.4}TiO_3)_{0.7}$—$(MgO)_{0.3}$ composite dielectric thin film fabricated according to Embodiment 2 as described above when used as a gate insulating film of a transistor, a thin film transistor was formed on a polyethyleneterephehalat (PET) substrate. The gate insulating film is desired to have a thickness of 100 nm to 1,000 nm to minimize pin hole formation and ensure uniform surface coating, and preferably, 300 nm. The PET has a low glass transition temperature of about 70° C. to 100° C., so a process temperature of the transistor fabricated on the PET substrate is preferably room temperature. In this embodiment, a transistor having a bottom gate structure as shown in FIG. 4 was configured focusing on the evaluation of the characteristics of the $(Ba_{0.6}Sr_{0.4}TiO_3)_{0.7}$—$(MgO)_{0.3}$ gate insulating film. It is also possible to configure a transistor having a top gate structure, and there is no restriction to particular transistor structures. The substrate may include a plastic substrate, a glass substrate, an insulating film-deposited Si wafer substrate, and the like, and there is no restriction to the use of any particular substrate.

First, a gate electrode is deposited with a thickness of 100 nm on the PET substrate through evaporation or sputtering. The gate electrode may be made of Al, Au, Cr, ITO (Sn doped $In_2O_3$), Mo, Pt, and the like. The $(Ba_{0.6}Sr_{0.4}TiO_3)_{0.7}$—$(MgO)_{0.3}$ composite dielectric thin film, the gate insulating film, was deposited with a thickness of 300 nm at a room temperature by using the sputtering method on the resultant structure according to Embodiment 2 as described above. To configure a channel region, both organic semiconductor and metal oxide semiconductor may be used, and in this embodiment, $InGaZnO_4$ was used. The gate insulating film was deposited with a thickness of 40 nm at a room temperature with RF power of 80 W at a process pressure of 60 mTorr, and under an Ar gas atmosphere of 5 sccm by using sputtering. Here, the width and length of the channel region were 2000 µm and 50 µm, respectively. Finally, aluminum (Al) was deposited through an evaporation process to form source and drain electrodes.

Figure 18:
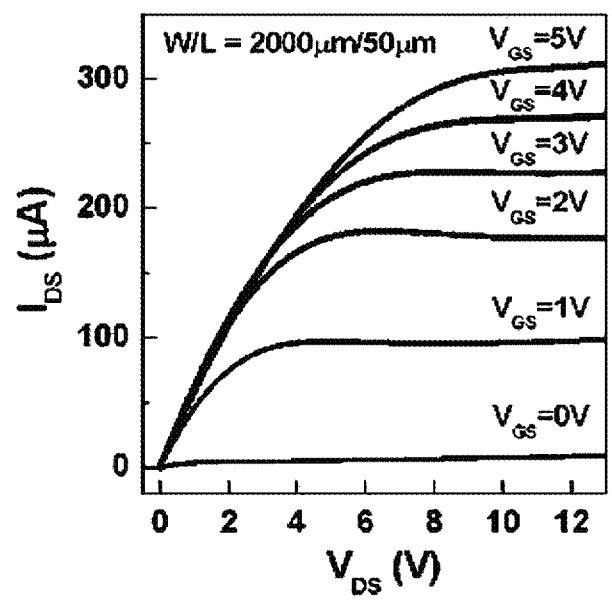
FIG. 18 is a graph showing the characteristics of $InGaZnO_4$ oxide semiconductor-based transistor fabricated according to a fifth embodiment of the present invention.

FIG. 18 is a graph showing the characteristics (output characteristics) of $InGaZnO_4$ oxide semiconductor-based transistor fabricated according to a fifth embodiment of the present invention. When a gate voltage ($V_{GS}$) is 0V, the transistor shows OFF characteristics, and as the value $V_{GS}$ increases, the source-drain current $I_{DS}$ is increased. The source-drain current density is considerably high, 300 µA, at 5V gate voltage. In this manner, the transistor operating at a voltage level lower than 5V could be fabricated due to the high dielectric constant value of $(Ba_{0.6}Sr_{0.4}TiO_3)_{0.7}$—$(MgO)_{0.3}$ composite dielectric thin film.

Figure 19:
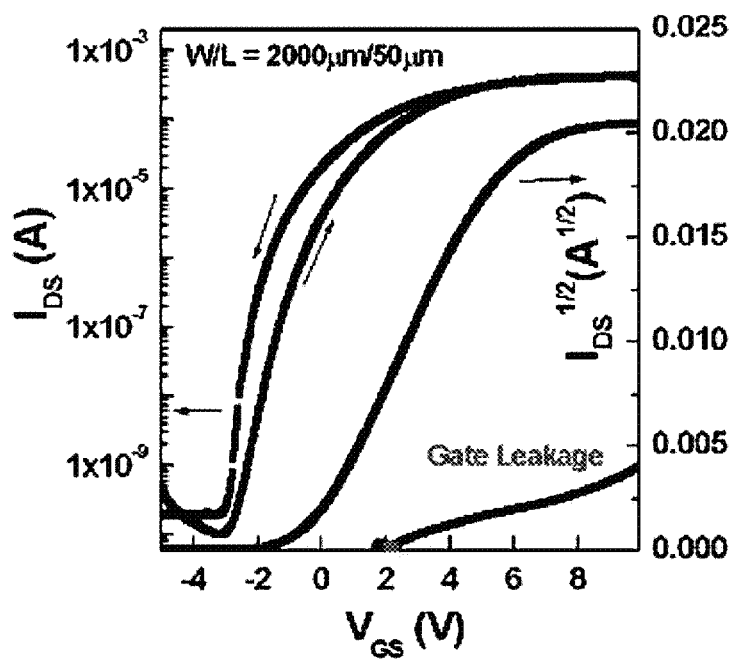
FIG. 19 is a graph sowing the electrical characteristics (transfer characteristics) of the $InGaZnO_4$ oxide semiconductor-based transistor fabricated according to the fifth embodiment of the present invention.

FIG. 19 is a graph sowing the electrical characteristics (transfer characteristics) of the $InGaZnO_4$ oxide semiconductor-based transistor fabricated according to the fifth embodiment of the present invention. Specifically, FIG. 19 shows source-drain current characteristics over a change in the gate voltage ($V_{GS}$) at $V_{DS}$ of 4V. The $InGaZnO_4$-based transistor fabricated on the PET substrate by using the $(Ba_{0.6}Sr_{0.4}TiO_3)_{0.7}$—$(MgO)_{0.3}$ composite dielectric thin film as a gate insulating film exhibits a high on/off ratio of $4.13×10^6$. In addition, it has a high field effect mobility value of 10.86 $cm^2/V·s$, a low threshold voltage (Vth) of −0.43 and a subthreshold swing (SS) value of 460 mV/dec, showing that good characteristics of can be obtained even on the plastic substrate.

[Embodiment 6] Fabrication of Transistor Using $(Bi_{1.5}Zn_{1.0}Nb_{1.5}O_7)_{1.7}$—$(MgO)_{0.3}$ Composite Dielectric Thin Film as Gate Insulating Film on Plastic Substrate In order to demonstrate the superiority of the $(Bi_{1.5}Zn_{1.0}Nb_{1.5}O_7)_{0.7}$—$(MgO)_{0.3}$ composite dielectric thin film fabricated according to Embodiment 4 as described above when used as a gate insulating film of a transistor, a thin film transistor was formed on a polyethyleneterephehalat (PET) substrate.

A gate electrode made of chromium (Cr) was formed with a thickness of 100 nm on the PET (3M company Inkjet transparent paper-CG3480) by using a shadow mask through a DC sputtering method. Subsequently, a gate insulating film having a composition of $(Bi_{1.5}Zn_{1.0}Nb_{1.5}O_7)_{0.7}$—$(MgO)_{0.3}$ was formed with a thickness of 250 nm on the entire surface of the PET substrate including the gate insulating film at a room temperature by using an RF sputtering method. Here, for a uniform film coating on the substrate and to minimize pin hole formation, the gate insulating film is preferably formed with 100 nm to 1000 nm, and in this embodiment, the gate insulating film was formed with the thickness of 250 nm.

Next, an n type ZnO, oxide semiconductor, was stacked with a thickness of 30 nm on the gate insulating film through the RF sputtering method to form a channel region. At this time, a process temperature was a room temperature, RF power was 115W, and the process pressure was 50 mTorr under an Ar gas atmosphere of 20 sccm. Finally, aluminum (Al) was deposited through an evaporation process to form source and drain electrodes. Here, a channel width and length of the TFT were 2000 µm and 200 µm, respectively.

Figure 20:
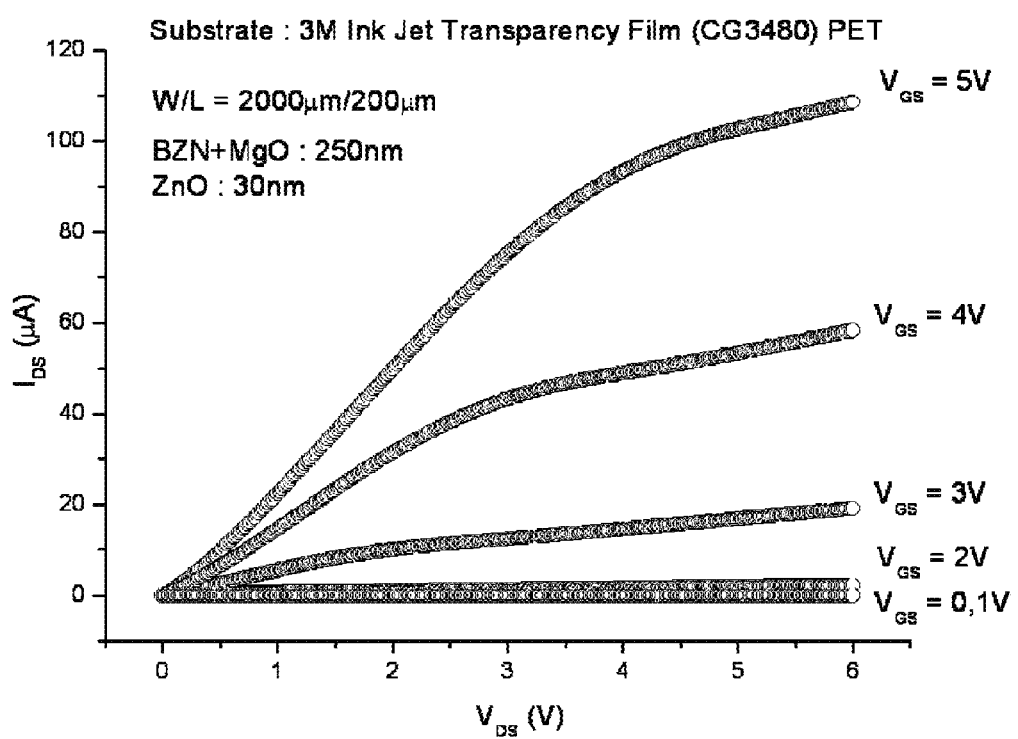
FIG. 20 is a graph showing output characteristics of a thin film transistor (TFT) fabricated according to a sixth embodiment of the present invention.

FIG. 20 is a graph showing output characteristics of a thin film transistor (TFT) fabricated according to a sixth embodiment of the present invention. As shown in FIG. 20, the transistor operating at a voltage level lower than 5V could be fabricated on the PET substrate due to the high dielectric constant value of $(Bi_{1.5}Zn_{1.0}Nb_{1.5}O_7)_{0.7}$-$(MgO)_{0.3}$ composite dielectric thin film. In addition, it is noted that when the gate voltage ($V_{GS}$) is 0V, the transistor shows OFF characteristics, and as the gate voltage ($V_{GS}$) is gradually increased, the source-drain current ($I_{DS}$) is increased.

Figure 21:
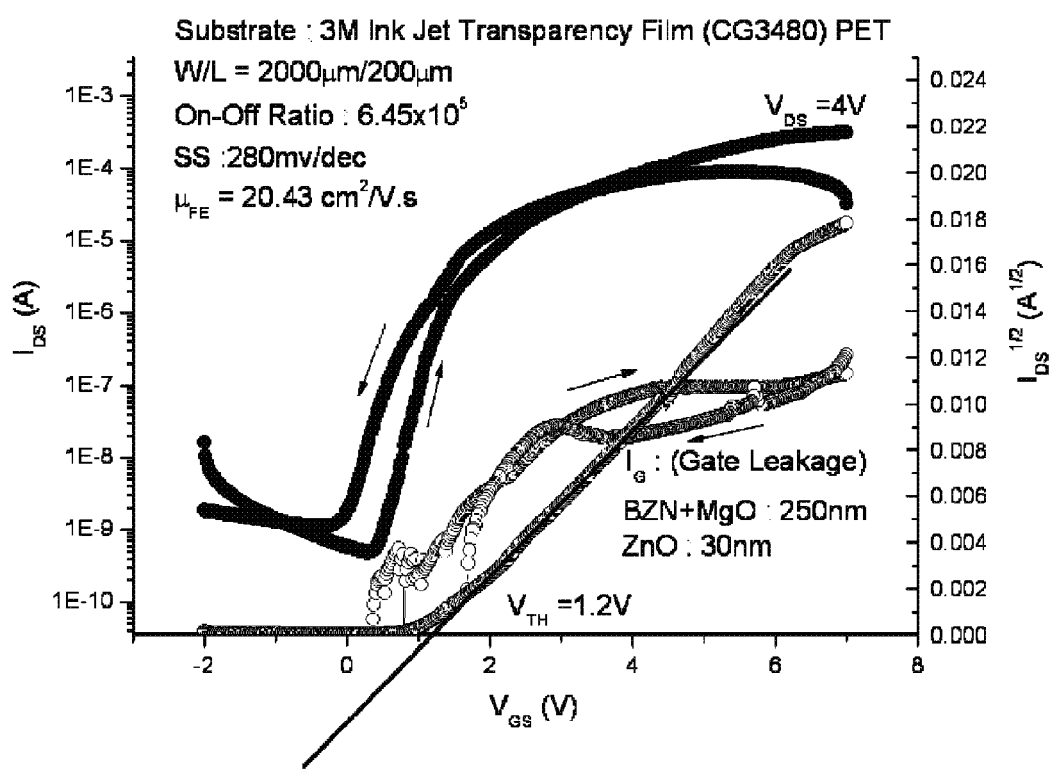
FIG. 21 is a graph showing transfer characteristics of the TFT fabricated according to the sixth embodiment of the present invention.

FIG. 21 is a graph showing transfer characteristics of the TFT fabricated according to the sixth embodiment of the present invention. Specifically, FIG. 21 shows source-drain current ($I_{DS}$) characteristics over a change in the gate voltage ($V_{GS}$) when $V_{DS}$ is 4V. As shown in FIG. 21, the thin film transistor fabricated according to Embodiment 6 exhibits a high on/off ratio of $6.45×10^5$. In addition, its field effect mobility value was high as 20.43 $cm^2/V·s$, threshold voltage (Vth) was low as 1.2V, and subthreshold swing (SS) value was 280 mV/dec, having good characteristics.

[Embodiment 7] Fabrication of Transistor Using $(Bi_{1.5}Zn_{1.0}Nb_{1.5}O_7)_{0.7}$—$(MgO)_{0.3}$ Composite Dielectric Thin Film as Gate Insulating Film on Glass Substrate A gate electrode made of chromium (Cr) was formed with a thickness of 100 nm on a glass substrate by using a shadow mask through a DC sputtering method. Subsequently, a gate insulating film having a composition of $(Bi_{1.5}Zn_{1.0}Nb_{1.5}O_7)_{0.7}$—$(MgO)_{0.3}$ was formed with a thickness of 250 nm on the entire surface of the glass substrate including the gate insulating film at a room temperature by using an RF sputtering method.

Next, an n type ZnO, oxide semiconductor, was stacked with a thickness of 30 nm on the gate insulating film through the RF sputtering method to form a channel region. At this time, a process temperature was a room temperature, RF power was 115W, and the process pressure was 50 mTorr under an Ar gas atmosphere of 20 sccm. Finally, aluminum (Al) was deposited through an evaporation process to form source and drain electrodes. Here, a channel width and length of the TFT were 2000 µm and 1550 µm, respectively.

Figure 22:
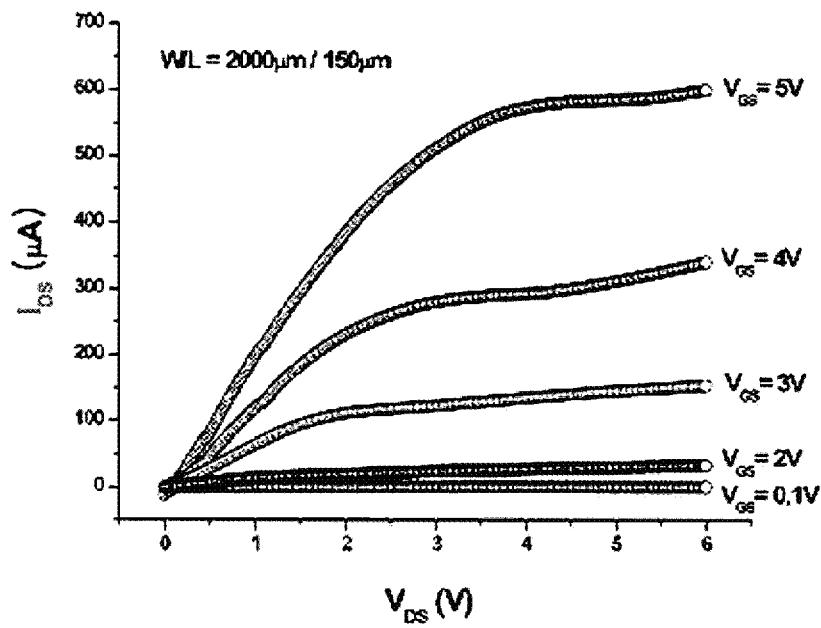
FIG. 22 is a graph showing output characteristics of the TFT fabricated according to a seventh embodiment of the present invention.

FIG. 22 is a graph showing output characteristics of the TFT fabricated according to a seventh embodiment of the present invention. As shown in FIG. 22, the transistor operating at a voltage level lower than 5V could be fabricated on the glass substrate due to the high dielectric constant value of $(Bi_{1.5}Zn_{1.0}Nb_{1.5}O_7)_{0.7}$—$(MgO)_{0.3}$ composite dielectric thin film. In addition, it is noted that when the gate voltage ($V_{GS}$) is 0V, the transistor shows OFF characteristics, and as the gate voltage ($V_{GS}$) is gradually increased, the source-drain current ($I_{DS}$) is increased. Meanwhile, unlike the thin film transistor formed on the plastic substrate as in Embodiment 6, current saturation characteristics are more clear, and the source-drain current ($I_{DS}$) density at the gate voltage ($V_{GS}$) of 5V was considerably high as 600 µA.

Figure 23:
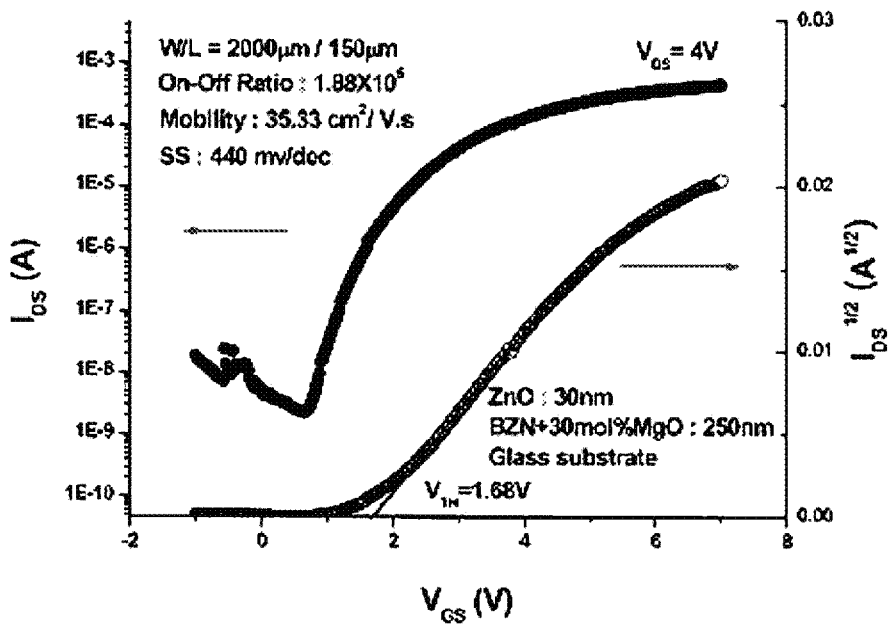
FIG. 23 is a graph showing transfer characteristics of the TFT fabricated according to the seventh embodiment of the present invention.

FIG. 23 is a graph showing transfer characteristics of the TFT fabricated according to the seventh embodiment of the present invention. Specifically, FIG. 23 shows source-drain current ($I_{DS}$) characteristics over a change in the gate voltage ($V_{GS}$) when $V_{DS}$ is 4V. As shown in FIG. 23, the thin film transistor fabricated according to Embodiment 7 exhibits a high on/off ratio of $1.88 \times 10^5$. In addition, its field effect mobility value was 35.33 cm$^2$/V·s, higher than that of the thin film transistor fabricated on the plastic substrate according to Embodiment 6. Its threshold voltage (Vth) was low as 1.68V, and subthreshold swing (SS) value was 440 mV/dec, having good characteristics.

A transparent transistor can be fabricated by changing the metal electrodes (source, drain and gate electrodes) used in the low-voltage driven transistor into transparent electrodes.

[Embodiment 8] Fabrication of Transparent Transistor Using Transparent Electrodes In order to demonstrate feasibility of application of the $(Ba_{0.6}Sr_{0.4}TiO_3)_{0.7}$—$(MgO)_{0.3}$ composite dielectric thin film to a transparent transistor, a thin film type transparent transistor was fabricated on a PET substrate. A gate insulating film has a fixed thickness of 100 nm to 1000 nm to minimize pin hole formation and for a uniform entire coating. Preferably, the gate insulating film has a thickness of 300 nm. The PE has a low glass transition temperature of 70° C. to 100° C., so a process temperature of the transistor fabricate don the PET substrate is preferably a room temperature. As the transparent electrode, a ZnO thin film with indium doped by 3% was used. As the substrate, a plastic substrate or a transparent substrate such as a glass substrate may be used.

First, a gate electrode was deposited with a thickness of 100 nm through evaporation or sputtering. As the gate electrode, ZnO, SnO$_2$ or ITO (Sn doped In$_2$O$_3$) doped with Al, Ga, or In, and the like, may be used. $(Ba_{0.6}Sr_{0.4}TiO_3)_{0.7}$—$(MgO)_{0.3}$ composite dielectric thin film was deposited with a thickness of 300 nm as a gate insulating film on the gate electrode. To configure a channel region, both organic semiconductor and metal oxide semiconductor may be used, and in this embodiment, InGaZnO$_4$ was used. The semiconducting film was deposited with a thickness of 40 nm at a room temperature with RF power of 80 W at a process pressure of 60 mTorr, and under an Ar gas atmosphere of 5 sccm by using sputtering. Here, the width and length of the channel region were 2000 μm and 200 μm, respectively. Finally, indium-doped ZnO thin film was deposited through a sputtering process to form source and drain electrodes.

Figure 24:
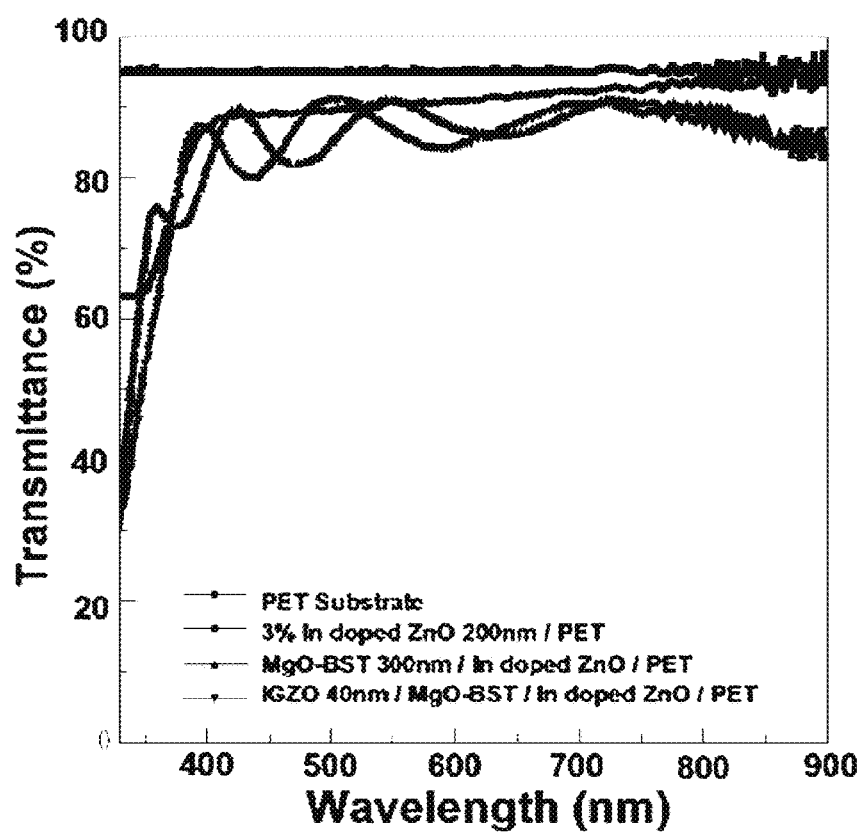
FIG. 24 is a graph showing transmission of a transistor including a PET substrate with 3% of indium-doped ZnO (200 nm) thin film, $(Ba_{0.6}Sr_{0.4}TiO_3)_{0.7}$—$(MgO)_{0.3}$ (300 nm) composite dielectric thin film, and an oxide semiconductor $InGaZnO_4$ (40 nm) thin film sequentially formed thereon.

FIG. 24 is a graph showing transmission of a transistor including a PET substrate with 3% of indium-doped ZnO (200 nm) thin film, $(Ba_{0.6}Sr_{0.4}TiO_3)_{0.7}$—$(MgO)_{0.3}$ (300 nm) composite dielectric thin film, and an oxide semiconductor InGaZnO$_4$ (40 nm) thin film sequentially formed thereon. All the layer of the thin film satisfy the transmittance of more than 80% at visible light, the requirement as a transparent element, which means that the thin film can be applied as a transparent element.

Figure 25:
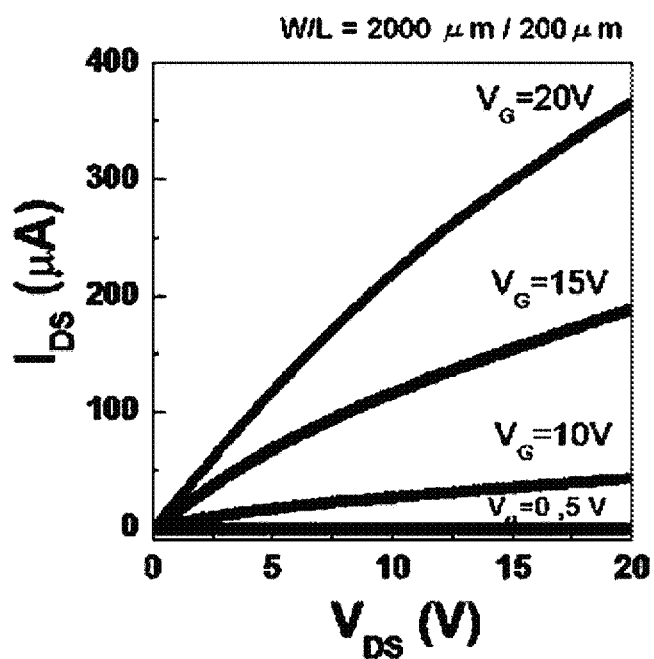
FIG. 25 is a graph showing output characteristics of an oxide semiconductor-based transparent transistor fabricated according to an eighth embodiment of the present invention.

FIG. 25 is a graph showing output characteristics of an oxide semiconductor-based transparent transistor fabricated according to an eighth embodiment of the present invention. It is noted that when the gate voltage ($V_{GS}$) is 0V, the transistor shows OFF characteristics, and as the $V_{GS}$ is increased, the source-drain current ($I_{DS}$) is increased.

Figure 26:
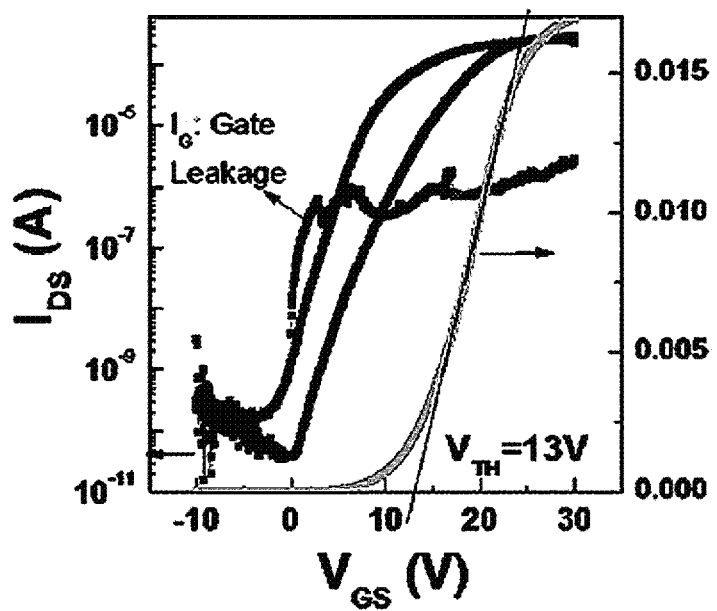
FIG. 26 is a graph showing electrical characteristics (transfer characteristics) of an oxide semiconductor-based transistor fabricated according to the eighth embodiment of the present invention.

FIG. 26 is a graph showing electrical characteristics (transfer characteristics) of an oxide semiconductor-based transistor fabricated according to the eighth embodiment of the present invention. A ZnO-based transistor fabricated on the PET substrate by using the $(Ba_{0.6}Sr_{0.4}TiO_3)_{0.7}$—$(MgO)_{0.3}$ as a gate insulating film exhibits a high on/off ratio of $7.89 \times 10^6$. In addition, its field effect mobility value is high as 17.03 cm$^2$/V·s and a threshold value (Vth) is 13V, exhibiting that the transistor can be applied as a transparent element on the plastic substrate.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for fabricating a composite dielectric thin film, the method comprising:
    preparing a ceramic target with a composition ratio of (dielectric)$_{1-x}$-(filler)$_x$(x=0.3~0.6), which comprises a first phase consisting of the dielectric and a second phase consisting of the filler, and the first and second phases being mixed with each other and
    performing physical vapor deposition on the ceramic target at a room temperature or up to 200° C. to thereby obtain a partially nanocrystalline composite dielectric thin film on a substrate which is a plastic substrate, a glass substrate or a silicon substrate, with an insulating film formed thereon,
    wherein the composite dielectric thin film comprises a dielectric matrix which is amorphous and amorphous, with partially nanocrystalline, and insulating fillers which are crystalline and uniformly distributed within the dielectric matrix
    without performing further heat treatment, and wherein the dielectric contains $Bi_{1.5}Zn_{1.0}Nb_{1.5}O_7$ (BZN).

2. The method of claim 1, wherein the ceramic target is obtained by mixing, molding and thermally treating a mixture of dielectric synthesis powders and filler powders, and the dielectric synthesis powders are obtained by mixing and thermally treating powders which consist of the dielectric.

3. The method of claim 1, wherein the physical vapor deposition process applies a sputtering method or a pulsed laser deposition (PLD) method.

4. The method of claim 1, wherein the filler is one selected from the group consisting of MgO, Al$_2$O$_3$, SiO$_2$ and LaAlO$_3$.

5. A method for fabricating a capacitor in which a first electrode, a dielectric layer and a second electrode are sequentially formed on a substrate, wherein the dielectric layer is formed by the method for fabricating a composite dielectric thin film of claim 1.

6. A method for fabricating a field effect transistor having a gate insulating film, wherein the gate insulating film is formed by using the method for fabricating a composite dielectric thin film of claim 1.

* * * * *